(12) United States Patent
Li et al.

(10) Patent No.: US 7,998,815 B2
(45) Date of Patent: Aug. 16, 2011

(54) SHALLOW TRENCH ISOLATION

(75) Inventors: Xia Li, San Diego, CA (US); Ming-Chu King, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 91 days.

(21) Appl. No.: 12/192,626

(22) Filed: Aug. 15, 2008

(65) Prior Publication Data

US 2010/0038744 A1 Feb. 18, 2010

(51) Int. Cl.
 *H01L 21/00* (2006.01)
(52) U.S. Cl. ........ 438/268; 438/208; 438/216; 438/406; 438/424
(58) Field of Classification Search .......... 438/208–219, 438/268, 406–424; 257/E21.564–565
See application file for complete search history.

(56) References Cited

U.S. PATENT DOCUMENTS

| | | | |
|---|---|---|---|
| 5,449,630 A | 9/1995 | Lur et al. | |
| 5,494,846 A * | 2/1996 | Yamazaki | 438/407 |
| 5,950,094 A * | 9/1999 | Lin et al. | 438/409 |
| 6,031,261 A * | 2/2000 | Kang | 257/302 |
| 6,188,122 B1 * | 2/2001 | Davari et al. | 257/532 |
| 6,194,253 B1 * | 2/2001 | Bolam et al. | 438/149 |
| 6,232,170 B1 * | 5/2001 | Hakey et al. | 438/243 |
| 6,248,645 B1 | 6/2001 | Matsuoka et al. | |
| 6,344,374 B1 * | 2/2002 | Tseng | 438/131 |
| 6,432,798 B1 | 8/2002 | Liu et al. | |
| 6,590,271 B2 | 7/2003 | Liu et al. | |
| 6,680,239 B1 | 1/2004 | Cha et al. | |
| 6,888,221 B1 * | 5/2005 | Joseph et al. | 257/565 |
| 7,023,051 B2 * | 4/2006 | Forbes | 257/347 |
| 7,115,463 B2 * | 10/2006 | Sadana et al. | 438/218 |
| 7,176,104 B1 | 2/2007 | Chen et al. | |
| 7,375,000 B2 * | 5/2008 | Nowak et al. | 438/382 |
| 7,521,760 B2 * | 4/2009 | Joshi et al. | 257/347 |
| 2001/0028097 A1 | 10/2001 | Matsuoka et al. | |
| 2004/0023473 A1 * | 2/2004 | Divakaruni et al. | 438/551 |
| 2004/0229426 A1 | 11/2004 | Lee et al. | |
| 2005/0026376 A1 | 2/2005 | Kim | |
| 2006/0063338 A1 | 3/2006 | Menon et al. | |
| 2006/0134882 A1 | 6/2006 | Zhang | |
| 2006/0286779 A1 | 12/2006 | Booth, Jr. et al. | |
| 2008/0150074 A1 | 6/2008 | Mishra | |

FOREIGN PATENT DOCUMENTS

JP 2004319632 11/2004

OTHER PUBLICATIONS

International Search Report-PCT/US2009/053879, International Search Authority-European Patent Office Nov. 5, 2009.
Written Opinion-PCT/US2009/053879, International Search Authority-European Patent Office Nov. 5, 2009.

\* cited by examiner

*Primary Examiner* — Michael S Lebentritt
(74) *Attorney, Agent, or Firm* — Semion Talpalatsky

(57) ABSTRACT

Shallow trench isolation methods are disclosed. In a particular embodiment, a method includes implanting oxygen under a bottom surface of a narrow trench of a silicon substrate and performing a high-temperature anneal of the silicon substrate to form a buried oxide layer. The method also includes performing an etch to deepen the narrow trench to reach the buried oxide layer. The method further includes depositing a filling material to form a top filling layer in the narrow trench.

20 Claims, 32 Drawing Sheets

SHALLOW TRENCH ISOLATION

I. FIELD

The present disclosure is generally related to shallow trench isolation.

II. DESCRIPTION OF RELATED ART

Shallow trench isolation (STI) can be used to provide electrical isolation between semiconductor devices. A shallow trench isolation structure can be formed by etching a narrow trench in a semiconductor surface and depositing an insulating material such as silicon dioxide within the trench. As process technologies evolve to support smaller device dimensions, deposition of insulating material may become increasingly difficult due to trench aspect ratios increasing with narrowing trench width.

III. SUMMARY

In a particular embodiment, a method includes implanting oxygen under a bottom surface of a narrow trench of a silicon substrate and performing a high-temperature anneal of the silicon substrate to form a buried oxide layer. The method also includes performing an etch to deepen the narrow trench to reach the buried oxide layer. The method further includes depositing a filling material into the trench to form a top filling layer in the narrow trench.

In another particular embodiment, the method includes implanting oxygen into a silicon substrate. The method includes performing a high-temperature anneal of the silicon substrate having the implanted oxygen to form a substrate with a buried oxide layer. The method also includes etching a narrow trench in a surface of the silicon substrate to expose the buried oxide layer. The method further includes depositing a filling material into the trench to form a top filling layer in the narrow trench.

In another particular embodiment, a semiconductor isolation structure is disclosed that includes a silicon substrate and a narrow trench in the silicon substrate. The narrow trench is filled with an isolating material. The semiconductor isolation structure also includes an implanted oxide layer under the narrow trench. The implanted oxide layer contacts at least a portion of the isolating material. At least a portion of the narrow trench is etched after the implanted oxide layer is formed.

A particular advantage provided by at least one of the disclosed embodiments is an isolation structure having a narrow width and an isolation depth, such that the isolation structure has an effective aspect ratio of approximately five to six. Such isolation structures may exhibit a large effective aspect ratio with a small width and may overcome difficulties for twenty-two nanometer and smaller fabrication technologies such as used for bulk complementary metal-oxide-semiconductor (CMOS) or bulk FinFET technologies.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
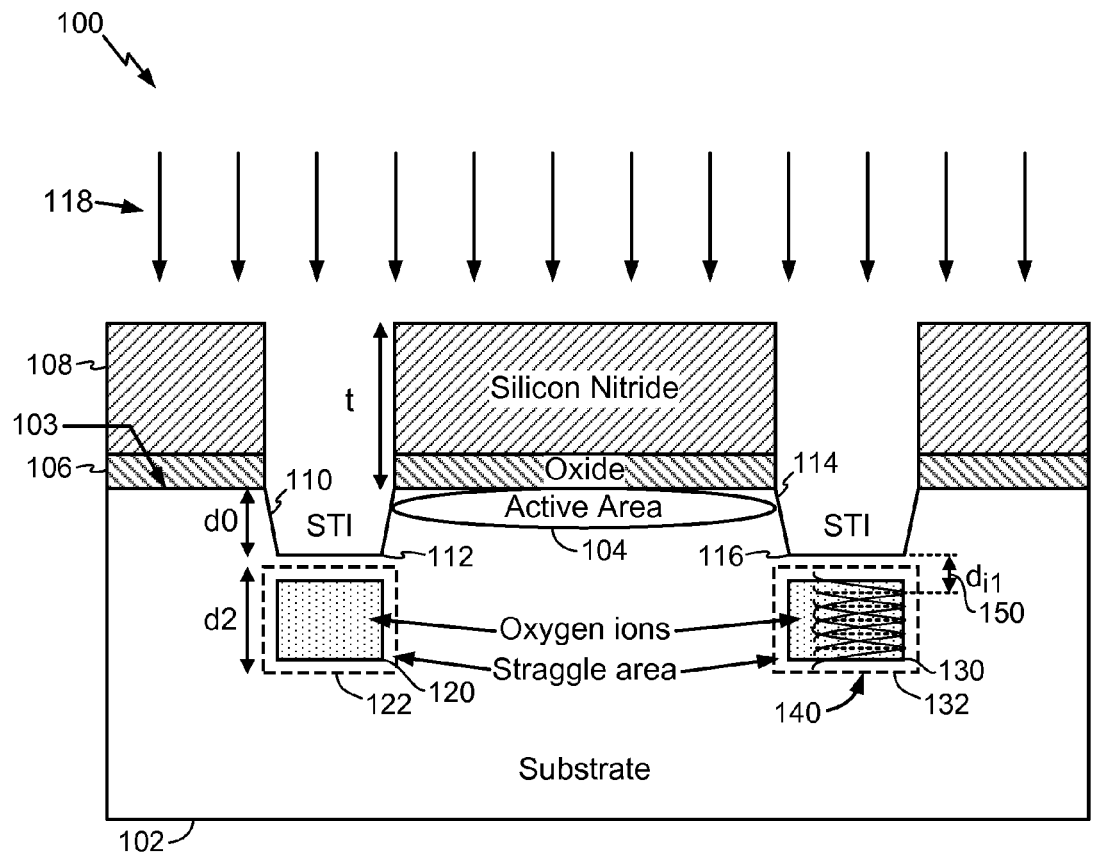
FIG. 1 is a diagram of a first illustrative embodiment of a system having a silicon substrate with oxygen implantation.
Figure 1:
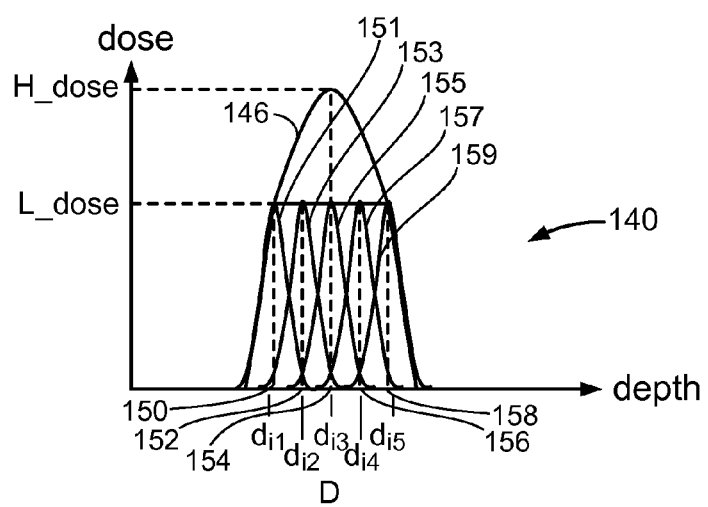

FIGS. 1-5 illustrate a first self-aligned fabrication process of isolation structures. FIG. 1 is a diagram of a first illustrative embodiment of a system having a silicon substrate with oxygen implantation. The system 100 includes a silicon substrate 102 having an active area 104 under an (silicon) oxide layer 106 and a silicon nitride layer 108. The oxide layer 106 and the silicon nitride layer 108 may form a hardmask on a silicon substrate 102 that defines an open region over narrow trenches 110 and 114. For example, the oxide layer 106 may be grown onto a surface 103 of the silicon substrate 102, and the silicon nitride layer 108 may be deposited on the oxide layer 106. A shallow trench isolation (STI) photolithography and etching process may be used to define a STI pattern in the oxide layer 106 and the silicon nitride layer 108.

The narrow trenches 110 and 114 have a depth d0 in the silicon substrate 102. Oxygen 118 is implanted under a bottom surface 112 and 116 of the narrow trenches 110 and 114, respectively, to form oxygen-rich regions 120 and 130 of implanted oxygen ions. The narrow trenches 110 and 114 may be STI features etched into the silicon substrate 102 via a shallow trench etch using the oxide layer 106 and the silicon nitride layer 108 as an etch mask. In a particular embodiment, the narrow trenches 110 and 114 have widths that are less than approximately 70 nanometers (nm).

The oxide layer 106 and the silicon nitride layer 108 have a combined height t. The combined height t may be determined so that the oxygen 118 being implanted does not have sufficient implant energy to reach the silicon substrate 102 through the silicon nitride layer 108 and the oxide layer 106. Thus, the combined layers 106 and 108 may act as an implantation mask to prevent oxygen implantation except under the bottom surfaces 112 and 116 of the narrow trenches 110 and 114.

The oxygen 118 may be implanted using multiple implant energies indicated by an implant distribution 140 that is depicted within a straggle area 132 and also generally depicted as a graph of dose (e.g., implanted ion density) as a function of depth of implantation. The implant distribution 140 includes a first implantation at a first implant energy of multiple implant energies to generate a first profile 151 at a first mean depth $d_{i1}$ 150. The implant distribution 140 also includes a second implantation at a second implant energy to generate a second profile 153 at a second mean depth $d_{i2}$ 152, a third implantation at a third implant energy to generate a third profile 155 at a third mean depth $d_{i3}$ 154, a fourth implantation at a fourth implant energy to generate a fourth profile 157 at a fourth mean depth $d_{i4}$ 156, and a fifth implantation at a fifth implant energy to generate a fifth profile 159 at a fifth mean depth $d_{i5}$ 158. The profiles 151, 153, 155, 157, and 159 combine to provide a relatively uniform dose (L_dose) between the first mean depth $d_{i1}$ 150 and the fifth mean depth $d_{i5}$ 158. In contrast, a single implantation is depicted, for comparison purposes only, having a single profile 146 at the third mean depth $d_{i3}$ provides a non-uniform dose with a peak dose H_dose.

The implanted oxygen ions may exhibit "straggle" or spreading of the oxygen ions beyond the regions 120 and 130. The straggle may occur vertically (i.e., the direction indicated by height of the straggle area d2) or laterally (i.e., in a horizontal direction perpendicular to the direction of the height d2), indicated as straggle areas 122 and 132. Generally, lateral straggle and vertical straggle, as a percentage of implant depth, increases as the depth of implantation decreases. In a particular embodiment, the oxygen 118 is implanted using a lowest implant energy of the multiple implant energies to result in a lateral straggle distance of the oxygen that is less than 35% of the mean implant depth $d_{i1}$ 150 corresponding to the lowest implant energy. For example, the lowest implant energy may result in a mean implant depth $d_{i1}$ 150 of at least a few hundred angstroms under the bottom surface 116 of the narrow trench 114. In a particular embodiment, the mean implant depth $d_{i1}$ 150 may be within a range from 100 to 1000 angstroms, or more specifically 200-700 angstroms, or even more specifically 300-400 angstroms.

Figure 2:
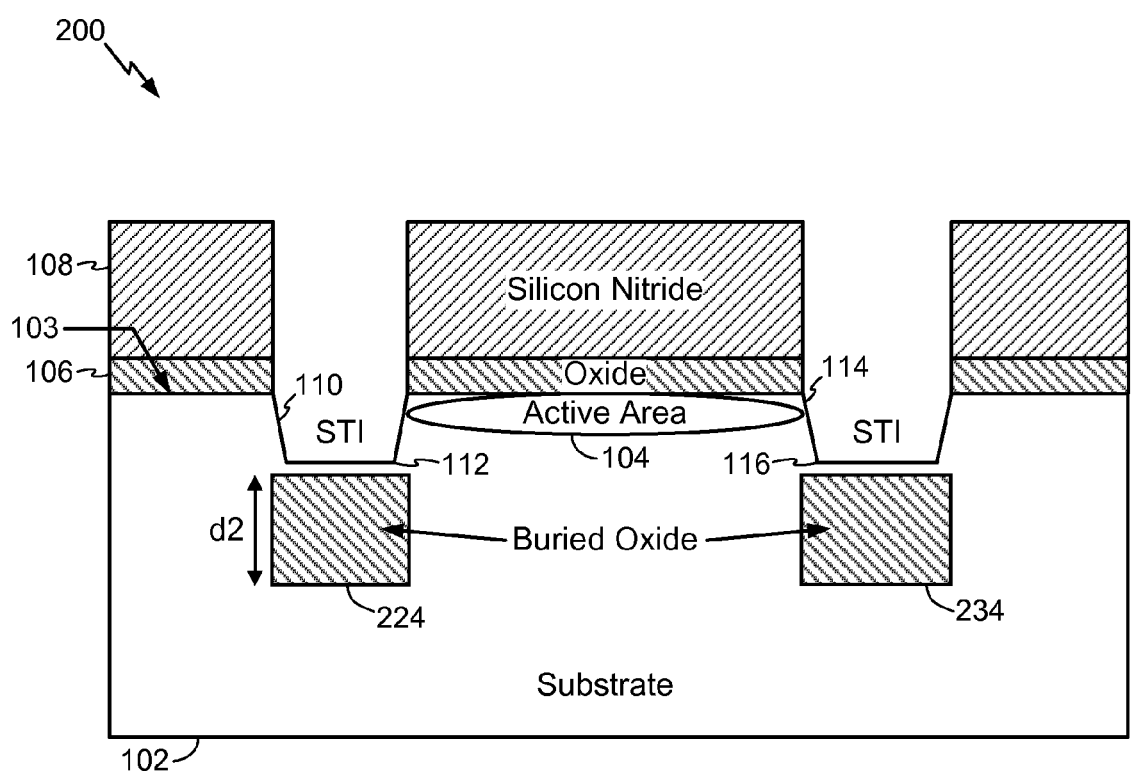
FIG. 2 is a diagram of a system formed from the system 100 of FIG. 1 after performing an anneal.

FIG. 2 is a diagram of a system formed form the system 100 of FIG. 1 after performing an anneal. The system 200 includes the silicon substrate 102 having the surface 103, the oxide layer 106, and the silicon nitride layer 108. The narrow trenches 110 and 114 having bottom surfaces 112 and 116, respectively, are adjacent to the active area 104 formed in the silicon substrate 102.

A high-temperature anneal has formed buried oxide (BOX) layers 224 and 234 of the implanted oxygen ions of the regions 120 and 130 depicted in FIG. 1, respectively. For example, the high-temperature anneal may be performed at around 1,300 degrees Celsius. The oxide layers 224 and 234 have a vertical dimension d2, corresponding to the vertical straggle areas 122 and 132 of the regions 120 and 130 of FIG. 1.

Figure 3:
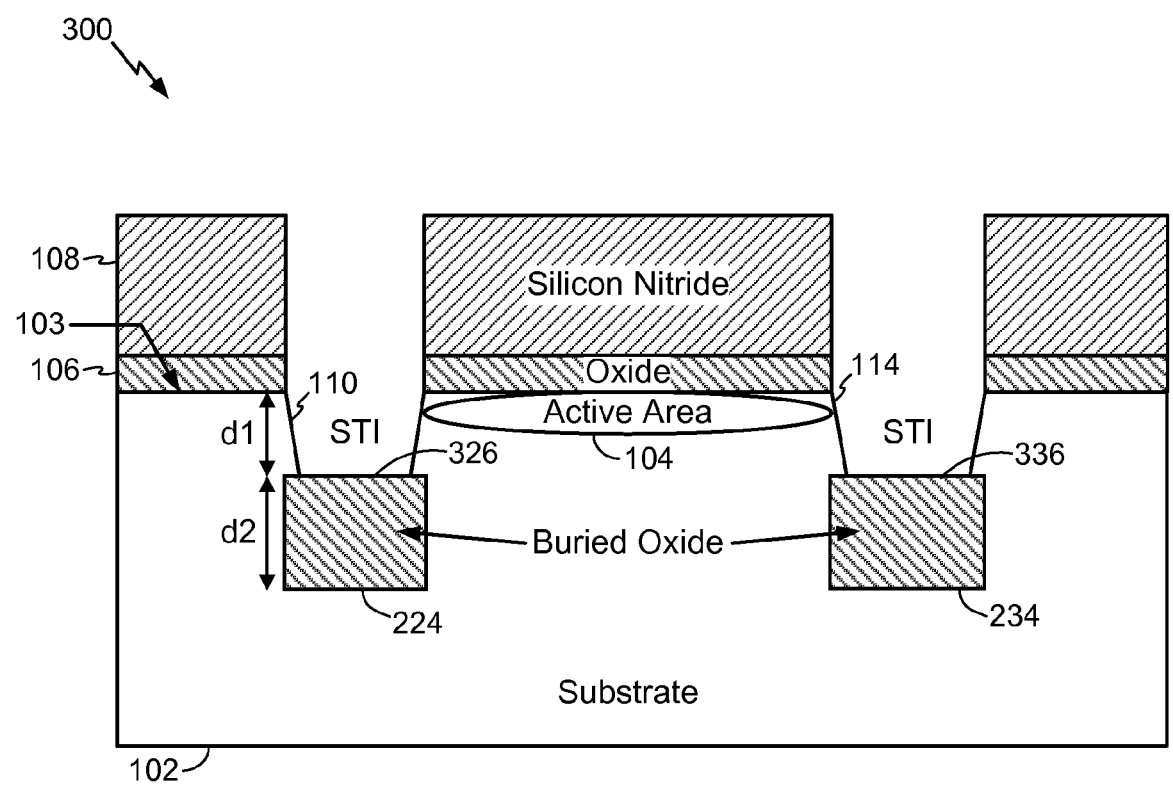
FIG. 3 is a diagram of a system formed from the system 200 of FIG. 2 after etching the narrow trenches to expose a buried oxide layer.

FIG. 3 is a diagram of a system formed form the system 200 of FIG. 2 after etching the narrow trenches 110, 114 to expose the buried oxide layers 224 and 234. The system 300 includes the silicon substrate 102 having the surface 103, the oxide layer 106, and the silicon nitride layer 108. The narrow trenches 110 and 114 are adjacent to the active area 104 formed in the silicon substrate 102.

The narrow trenches 110 and 114 have been etched to deepen the narrow trenches 110 and 114 to reach the respective buried oxide layers 224 and 234. For example, a STI etch may have been performed using the oxide layer 106 and the silicon nitride layer 108 as etch masks to remove material from the bottom surfaces 112 and 116 (as depicted in FIG.1 ) of the narrow trenches 110 and 114. The material is removed from the bottom surfaces 112 and 116 to expose at least a portion of a surface 326 and 336 of the buried oxide layers 224 and 236 under the trenches 110 and 114, respectively. The trenches 110 and 114 have a depth d1.

Figure 4:
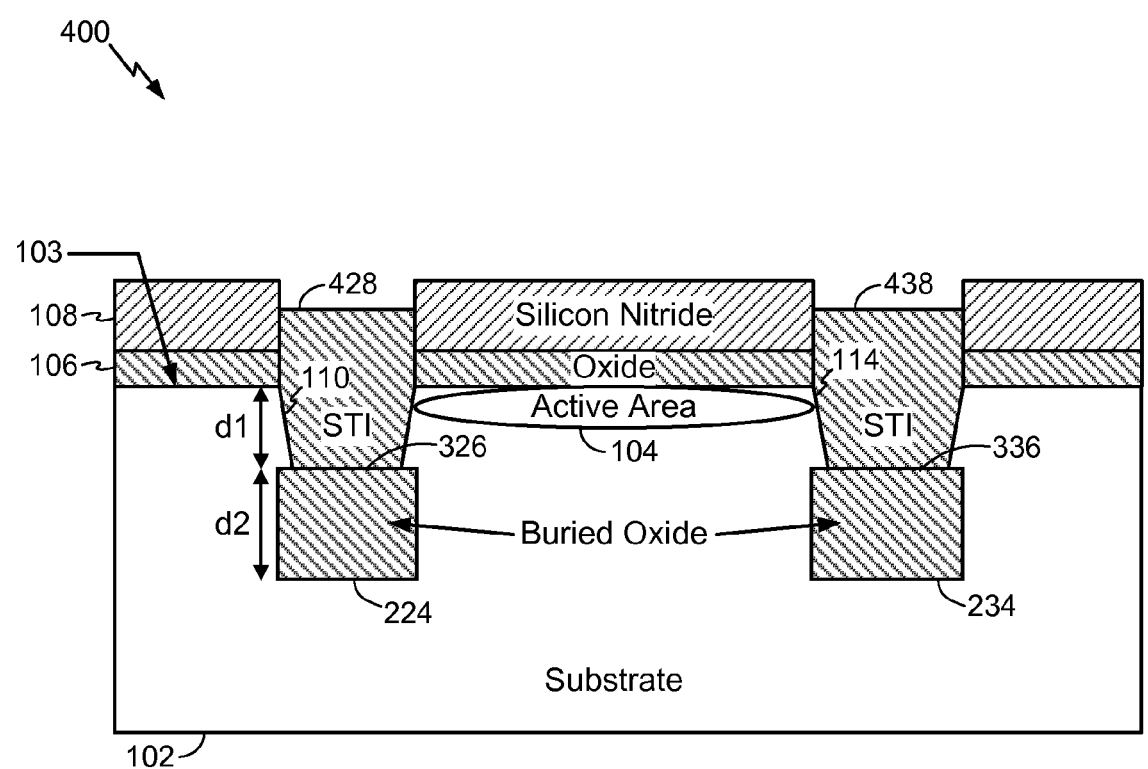
FIG. 4 is a diagram of a system formed from the system 300 of FIG. 3 after depositing a filling material and a Chemical-Mechanical Planarization (CMP) process in the narrow trenches.

FIG. 4 is a diagram of a system formed form the system 300 of FIG. 3 after depositing a filling material in the narrow trenches 110 and 114. The system 400 includes the silicon substrate 102 having the surface 103, the oxide layer 106, and the silicon nitride layer 108. The narrow trenches 110 and 114 are adjacent to the active area 104 formed in the silicon substrate 102. A filing material has been deposited to form a top filling layer 428 in the narrow trench 110 and a top filling layer 438 in the narrow trench 114.

In a particular embodiment, the filling material that forms the top filling layers 428 and 438 is an oxide material having electrical isolation characteristics. The top filling layer 428 extends from the surface 326 of the buried oxide layer 224 to above the surface 103 of the substrate 102. Similarly, the top filling layer 438 extends from the surface 336 of the buried oxide layer 234 to above the surface 103 of the substrate 102.

After depositing the filling material, a reverse trench photo/etch process may remove extra filling material, and an oxide or isolation film chemical-mechanical planarization (CMP) may be performed and stopped at the silicon nitride layer 108.

Figure 5:
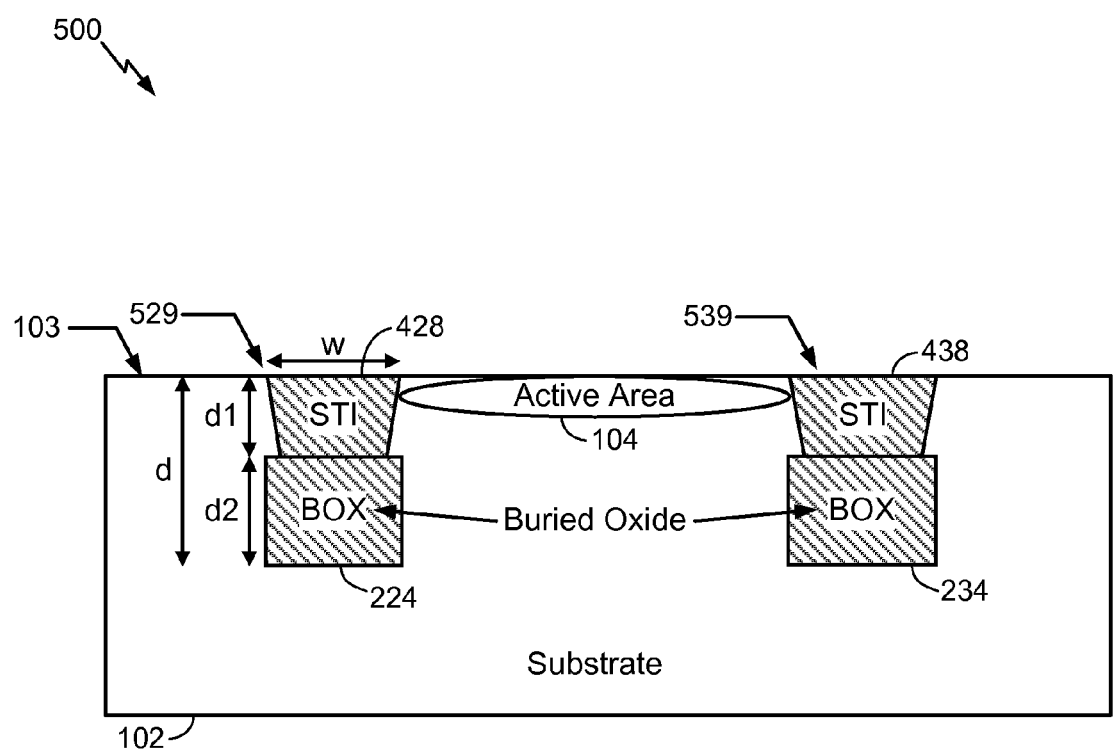
FIG. 5 is a diagram of a semiconductor product formed from the system 100 of FIG. 1 depicting isolation structures with a large effective aspect ratio.

FIG. 5 is a diagram of a semiconductor product formed form the system 100 of FIG. 1 depicting isolation structures with a large effective aspect ratio. The semiconductor product 500 includes isolation structures 529 and 539 that may be produced in accordance with FIGS. 1-4. In a particular illustrative embodiment, the semiconductor product 500 is formed by stripping masking layers of the system 400 depicted in FIG. 4 to remove the silicon nitride layer 108 and the oxide layer 106 from the surface 103 of the substrate 102.

The isolation structure 529 includes the buried oxide (BOX) layer 224 having a vertical height d2 and the top filling layer 428 having the vertical height d1, resulting in an effective isolation depth d under the surface 103 of the substrate 102. The isolation structure 539 includes the buried oxide (BOX) layer 234 and the top filling layer 438.

In a particular embodiment, an oxide barrier formed by the BOX layer 224 or 234 and the top filling layer 428 or 438 has an effective aspect ratio within a first range of approximately 5 to 6 with a narrow trench aspect ratio within a second range of approximately 3 to 4. For example, a ratio of the depth d+t (i.e., the combined height t depicted in FIG. 1 plus the depth d depicted in FIG. 5) to the width w of the isolation structure 529 or 539 may have a value in the range of 5 to 6. The effective aspect ratio of 5 to 6 may be obtained with a narrow trench aspect ratio (e.g., a ratio of the depth d1+t to the width w) within a range of 3 to 4. In another illustrative embodiment, an oxide barrier formed by the buried oxide layer 224 or 234 and the top filling layer 428 or 438 has an effective aspect ratio within a first range of approximately 3 to 4 with a narrow trench aspect ratio within a second range of approximately 1 to 2.

In a particular embodiment, difficulties may be encountered when forming a single trench with a width less than 70 nm and with an aspect ratio of 5 to 6 (including a silicon nitride thickness) and filling the trench with an oxide material to form an isolation structure. For example, depositing the oxide material may result in voids or holes, such as resulting from oxide material deposited on trench walls, closing off the trench and preventing further deposition into a lower portion of the trench. By forming the isolation structure 529 or 539 using the filling material 428 or 438 extending down to the buried oxide layer 224 or 234, such problems may be avoided while achieving an effective aspect ratio of 5 to 6, or larger.

In addition, by implanting oxygen a distance beneath the narrow trenches, difficulties such as excessive lateral straggling arising from shallow implantation may be avoided. Further, because the oxygen is implanted a distance under a bottom surface of the narrow trenches, lateral straggling occurs far from the active area and may have relatively little effect on device operation.

Figure 6:
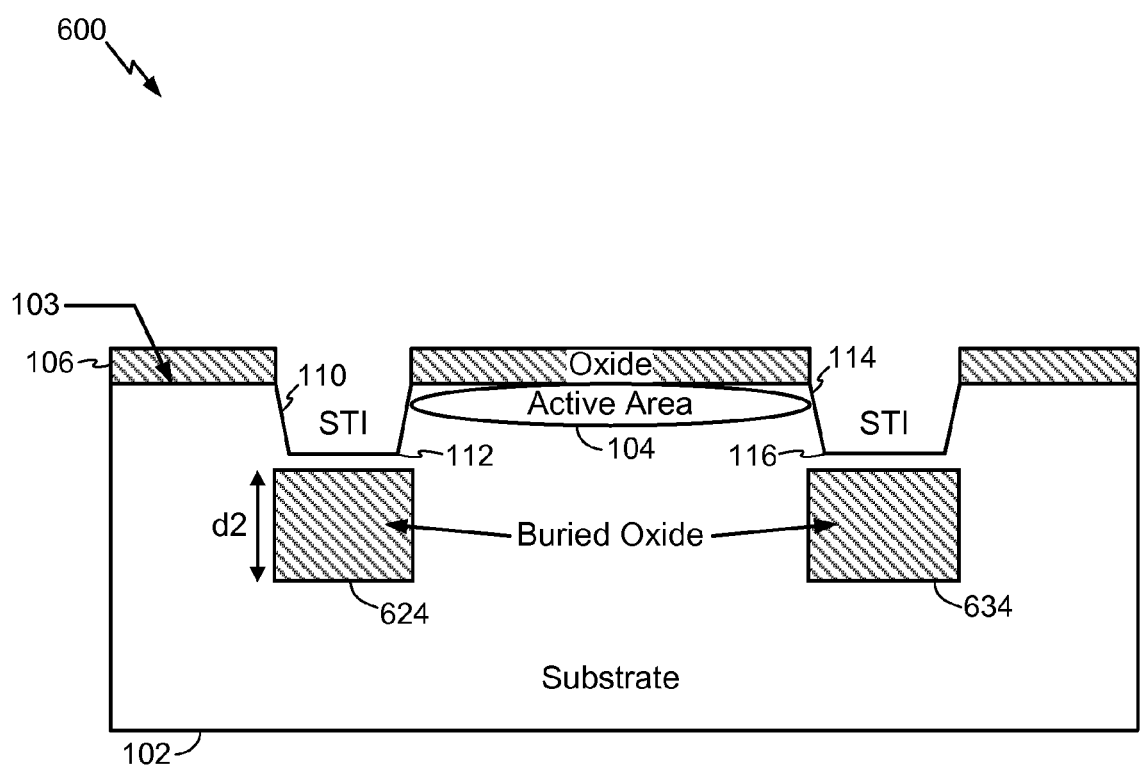
FIG. 6 is a diagram of a system formed from the system 100 of FIG. 1 after removing a silicon nitride layer and after performing an anneal.
Figure 7:
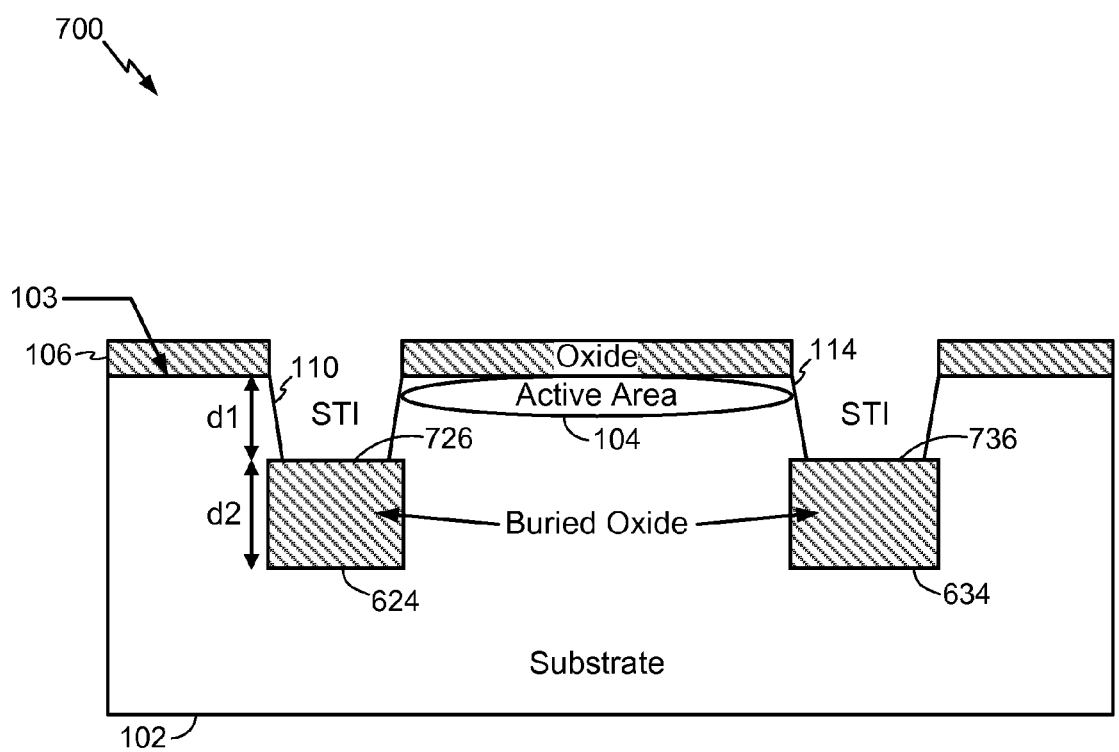
FIG. 7 is a diagram of a system formed from the system 600 of FIG. 6 after etching the narrow trenches to expose a buried oxide layer.
Figure 8:
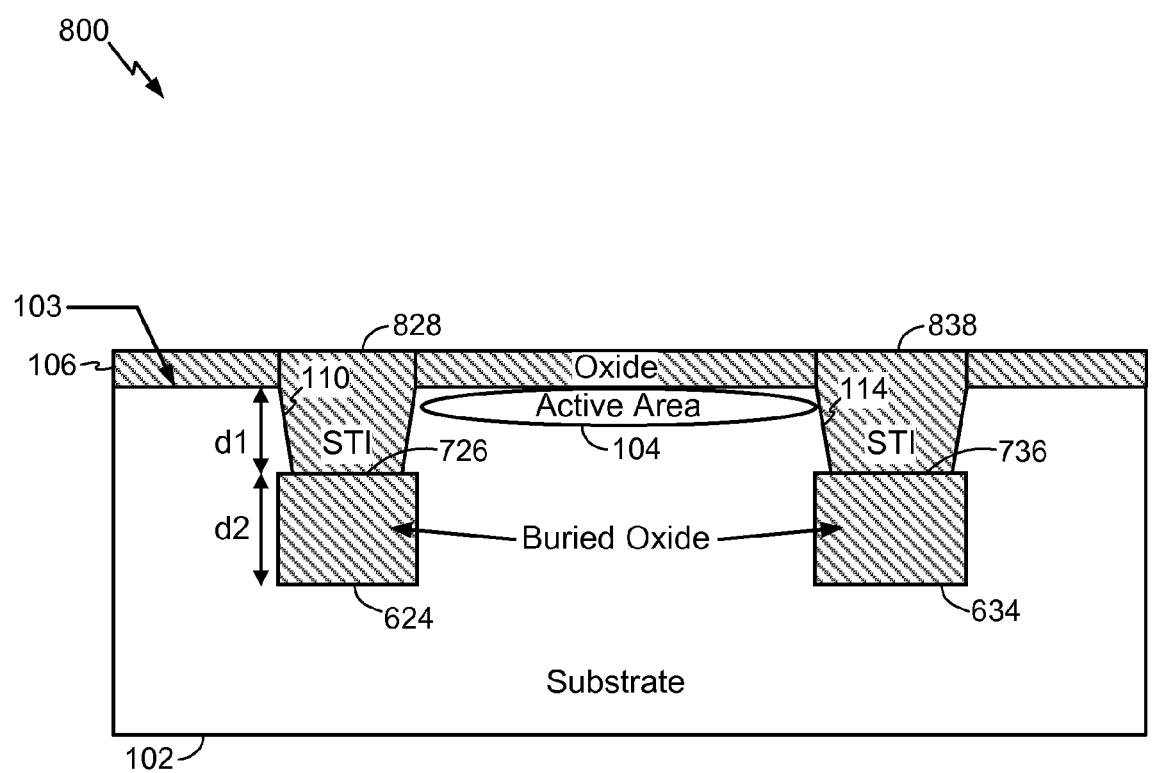
FIG. 8 is a diagram of a system formed from the system 700 of FIG. 7 after depositing a filling material and a CMP process in the narrow trenches.

FIGS. 6-8 illustrate another embodiment of the self-aligned fabrication process of FIGS. 1-5 where the silicon nitride layer is removed prior to annealing. FIGS. 6-8 may be used in place of FIGS. 2-4, respectively.

FIG. 6 depicts a diagram of a system formed form the system 100 of FIG. 1 after removing a silicon nitride layer and after performing an anneal. The system 600 includes the silicon substrate 102 having the surface 103, and the oxide layer 106. The narrow trenches 110 and 114 having bottom surfaces 112 and 116, respectively, are adjacent to the active area 104 formed in the silicon substrate 102. In contrast to FIG. 2, the silicon nitride layer 108 has been removed prior to performing a high-temperature anneal process.

The high-temperature anneal has formed buried oxide layers 624 and 634 of the implanted oxygen ions of the regions 120 and 130 depicted in FIG. 1, respectively. For example, the high-temperature anneal may be performed at around 1,300 degrees Celsius. The oxide layers 624 and 634 have a vertical dimension d2, corresponding to the vertical straggle area of the regions 120 and 130 of FIG. 1.

FIG. 7 is a diagram of a system formed form the system 600 of FIG. 6 after etching the narrow trenches 110, 114 to expose the buried oxide layers 624 and 634. The system 700 includes the silicon substrate 102 having the surface 103, and the oxide layer 106. The narrow trenches 110 and 114 are adjacent to the active area 104 formed in the silicon substrate 102.

The narrow trenches 110 and 114 have been etched to deepen the narrow trenches 110 and 114 to reach the respective buried oxide layers 624 and 634. For example, a STI etch may have been performed using the oxide layer 106 as an etch mask to remove material from the bottom surfaces 112 and 116 (as depicted in FIG. 1) of the narrow trenches 110 and 114. The material is removed from the bottom surfaces 112 and 116 to expose at least a portion of a surface 726 and 736 of the buried oxide layers 624 and 636 under the trenches 110 and 114, respectively. The trenches 110 and 114 have a depth d1.

FIG. 8 is a diagram of a system formed form the system 700 of FIG. 7 after depositing a filling material in the narrow trenches 110 and 114. The system 800 includes the silicon substrate 102 having the surface 103, and the oxide layer 106. The narrow trenches 110 and 114 are adjacent to the active area 104 formed in the silicon substrate 102. A filing material has been deposited to form a top filling layer 828 in the narrow trench 110 and a top filling layer 838 in the narrow trench 114.

In a particular embodiment, the filling material that forms the top filling layers 828 and 838 is an oxide material having electrical isolation characteristics. The top filling layer 828 extends from the surface 726 of the buried oxide layer 624 to above the surface 103 of the substrate 102. Similarly, the top filling layer 838 extends from the surface 736 of the buried oxide layer 634 to above the surface 103 of the substrate 102.

After depositing the filling material, a reverse trench photo/etch process may remove extra filling material, and an oxide or isolation film chemical-mechanical planarization (CMP) may be performed and stopped at the oxide 106. Processing may continue in accordance with FIG. 5 to form the semiconductor product 500.

Figure 9:
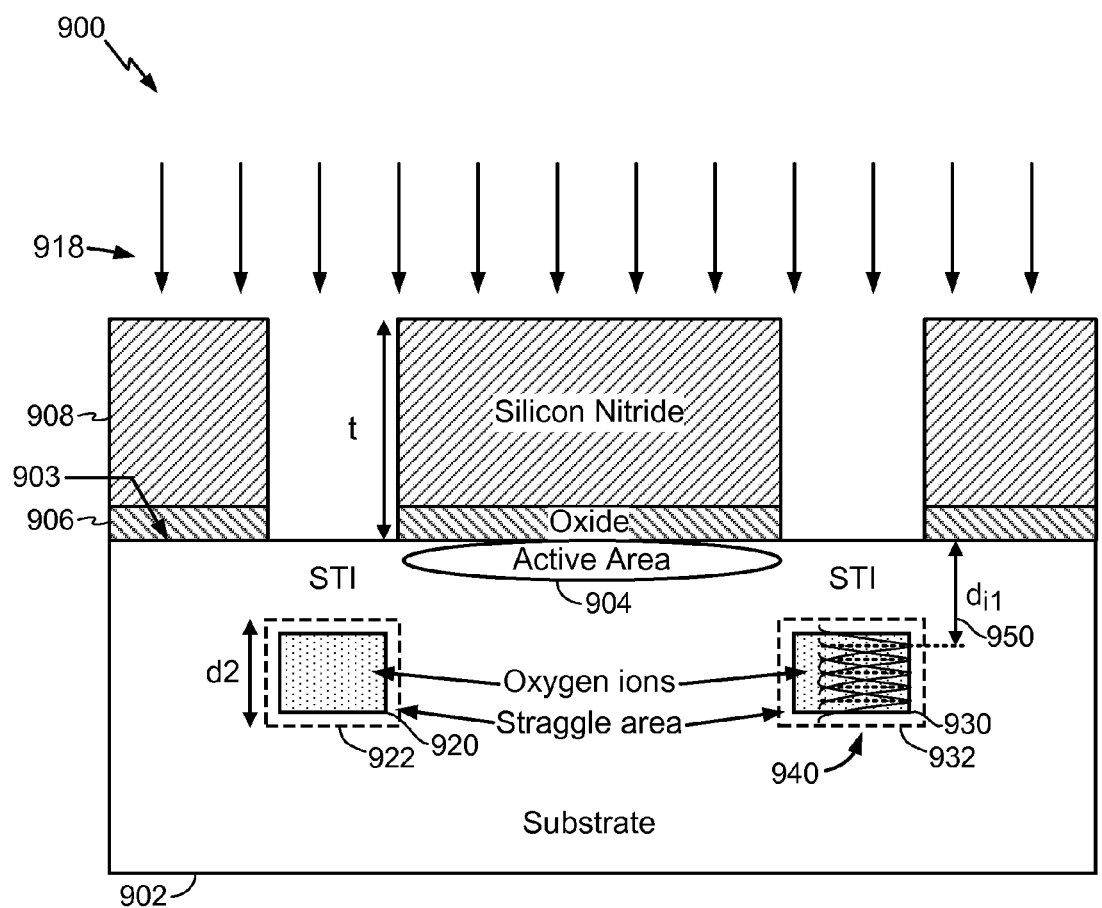
FIG. 9 is a diagram of a second illustrative embodiment of a system having a silicon substrate with oxygen implantation.

FIGS. 9-13 illustrate a second self-aligned fabrication process of isolation structures. FIG. 9 is a diagram of a second illustrative embodiment of system having a silicon substrate with oxygen implantation. The system 900 includes a silicon substrate 902 having a surface 903, an active area 904 under an oxide layer 906 and a silicon nitride layer 908. The oxide layer 906 and the silicon nitride layer 908 may form a hardmask on the silicon substrate 902 that defines an open region over oxygen-rich regions 920 and 930. For example, the oxide layer 906 may be grown onto the silicon substrate 902, and the silicon nitride layer 908 may be deposited on the oxide layer 906. A shallow trench isolation (STI) photolithography and etching process may be used to define a STI pattern in the oxide layer 906 and the silicon nitride layer 908.

Oxygen 918 is implanted under a surface of the silicon substrate 902 to form the oxygen-rich regions 920 and 930 of implanted oxygen ions. The oxide layer 906 and the silicon nitride layer 908 have a combined height t. The combined height t may be determined so that the oxygen does not have sufficient implant energy to reach the silicon substrate 902 through the silicon nitride layer 908 and the oxide layer 906. Thus, the combined layers 906 and 908 may act as an implantation mask to prevent oxygen implantation except into the oxygen-rich regions 920 and 930.

The oxygen 918 may be implanted using multiple implant energies indicated by an implant distribution 940 that is depicted within a straggle area 932. The implant distribution 940 includes a first implantation at a first implant energy of multiple implant energies to implant at a first mean depth $d_{i1}$ 950. As discussed with respect to FIG. 1, the multiple implant energies enable a substantially uniform dose of oxygen ions within the straggle area 932.

The implanted oxygen ions may exhibit "straggle" or spreading of the oxygen ions beyond the regions 920 and 930. The straggle may occur vertically (i.e., the direction indicated by height of the straggle area d2) or laterally (i.e., in a horizontal direction perpendicular to the direction of the height d2), indicated as straggle areas 922 and 932. Generally, lateral straggle and vertical straggle, as a percentage of implant depth, increases as the depth of implantation decreases. In a particular embodiment, the oxygen 918 is implanted using a lowest implant energy of the multiple implant energies to result in a lateral straggle distance of the oxygen that is less than 35% of the mean implant depth $d_{i1}$ corresponding to the lowest implant energy. For example, the lowest implant energy may result in a mean implant depth $d_{i1}$ of at least a few hundred angstroms under the surface of the silicon substrate 902. In a particular embodiment, the mean implant depth $d_{i1}$ may be within a range from 100 to 1000 angstroms, or more specifically 200-700 angstroms, or even more specifically 300-400 angstroms.

Figure 10:
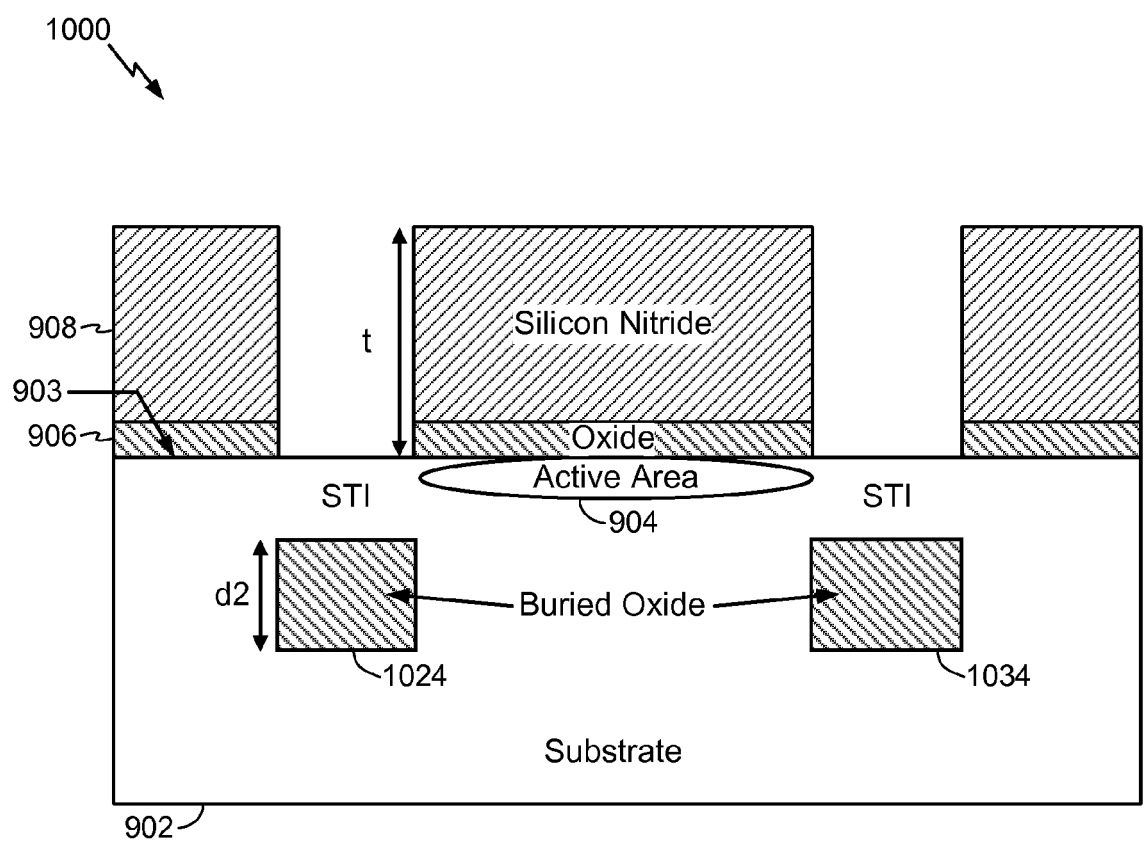
FIG. 10 is a diagram of a system formed from the system 900 of FIG. 9 after performing an anneal.

FIG. 10 is a diagram of a system formed form the system 900 of FIG. 9 after performing an anneal. The system 1000 includes the silicon substrate 902 having the surface 903, the oxide layer 906, and the silicon nitride layer 908. The active area 904 is formed in the silicon substrate 902.

A high-temperature anneal has formed buried oxide layers 1024 and 1034 of the implanted oxygen ions of the regions 920 and 930 depicted in FIG. 9, respectively. For example, the high-temperature anneal may be performed at around 1,300 degrees Celsius. The oxide layers 1024 and 1034 have a vertical dimension d2, corresponding to the vertical straggle areas 922 and 932 of the regions 920 and 930 of FIG. 9.

Figure 11:
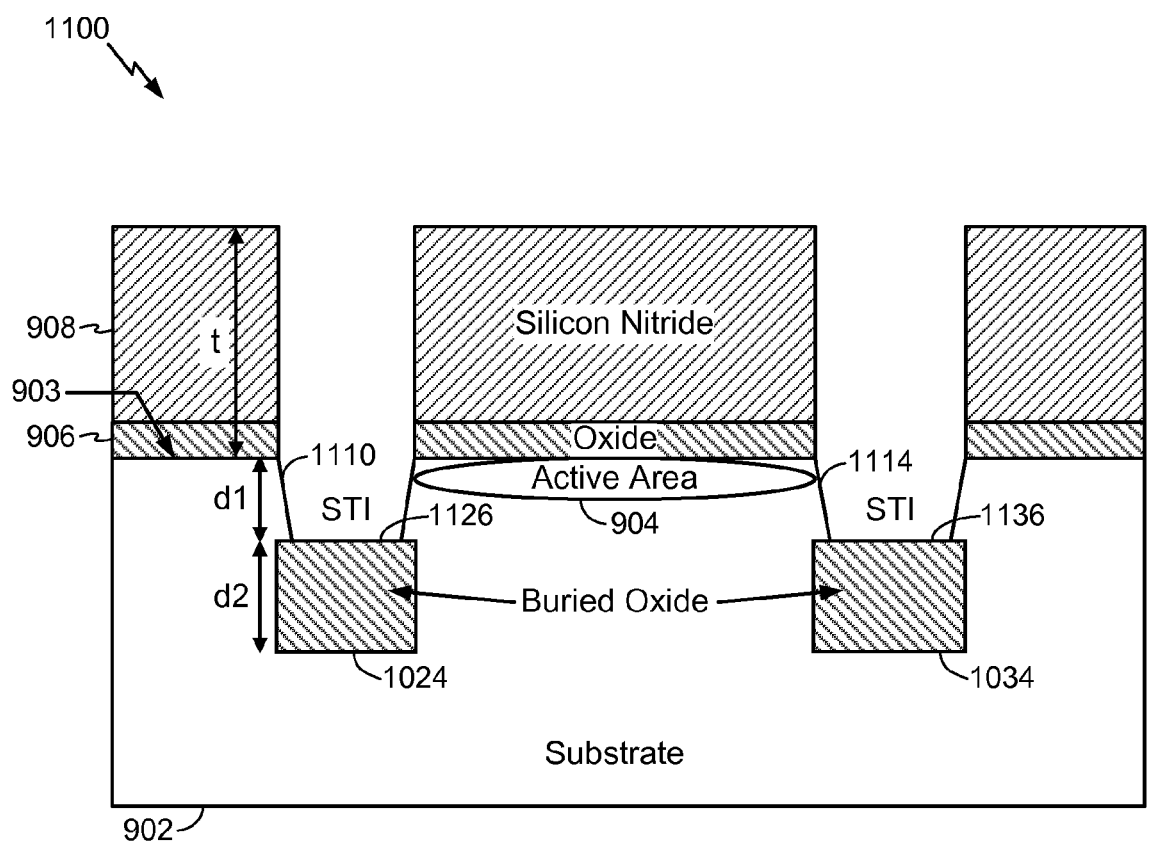
FIG. 11 is a diagram of a system formed from the system 1000 of FIG. 10 after etching narrow trenches to reach a buried oxide layer.

FIG. 11 is a diagram of a system formed form the system 1000 of FIG. 10 after etching narrow trenches to expose the buried oxide layers 1024 and 1034. The system 1100 includes the silicon substrate 902 having the surface 903, the oxide layer 906, and the silicon nitride layer 908. The active area 904 is formed in the silicon substrate 902.

Narrow trenches 1110 and 1114 have been etched to reach the respective buried oxide layers 1024 and 1034. For example, a STI etch may have been performed using the oxide layer 906 and the silicon nitride layer 908 as etch masks. Material is removed from the silicon substrate 902 to expose at least a portion of a surface 1126 and 1136 of the buried oxide layers 1024 and 1036, respectively. The trenches 1110 and 1114 have a depth d1.

Figure 12:
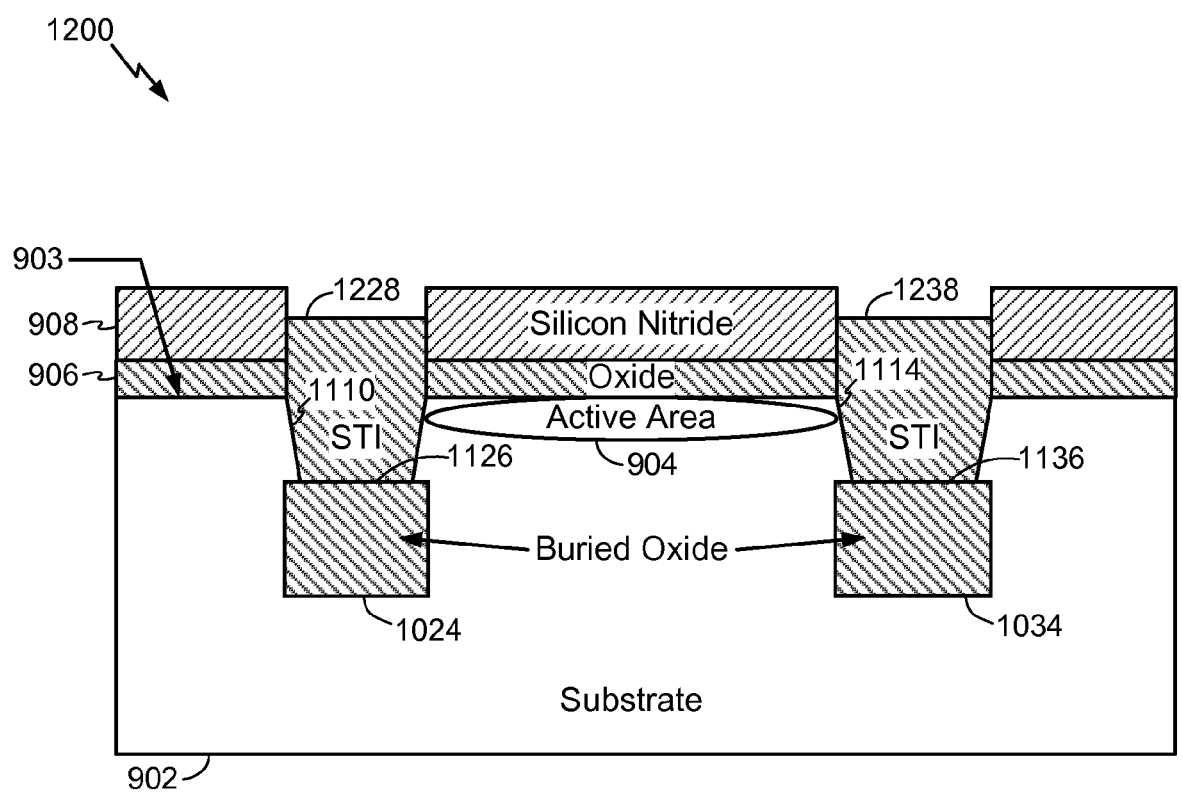
FIG. 12 is a diagram of a system formed from the system 1100 of FIG. 11 after depositing a filling material and a CMP process in the narrow trenches.

FIG. 12 is a diagram of a system formed form the system 1100 of FIG. 11 after depositing a filling material in the narrow trenches 1110 and 1114. The system 1200 includes the silicon substrate 902 having the surface 903, the oxide layer 906, and the silicon nitride layer 908. The narrow trenches 1110 and 1114 are adjacent to the active area 904 formed in the silicon substrate 902. A filling material has been deposited to form a top filling layer 1228 in the narrow trench 1110 and a top filling layer 1238 in the narrow trench 1114.

In a particular embodiment, the filling material that forms the top filling layers 1228 and 1238 is an oxide material having electrical isolation characteristics. The top filling layer 1228 extends from the surface 1126 of the buried oxide layer 1024 to above the surface 903 of the substrate 902. Similarly, the top filling layer 1238 extends from the surface 1136 of the buried oxide layer 1034 to above the surface 903 of the substrate 902.

After depositing the filling material, a reverse trench photo/etch process may remove extra filling material, and an oxide or isolation film chemical-mechanical planarization (CMP) may be performed and stopped at the silicon nitride layer 908.

Figure 13:
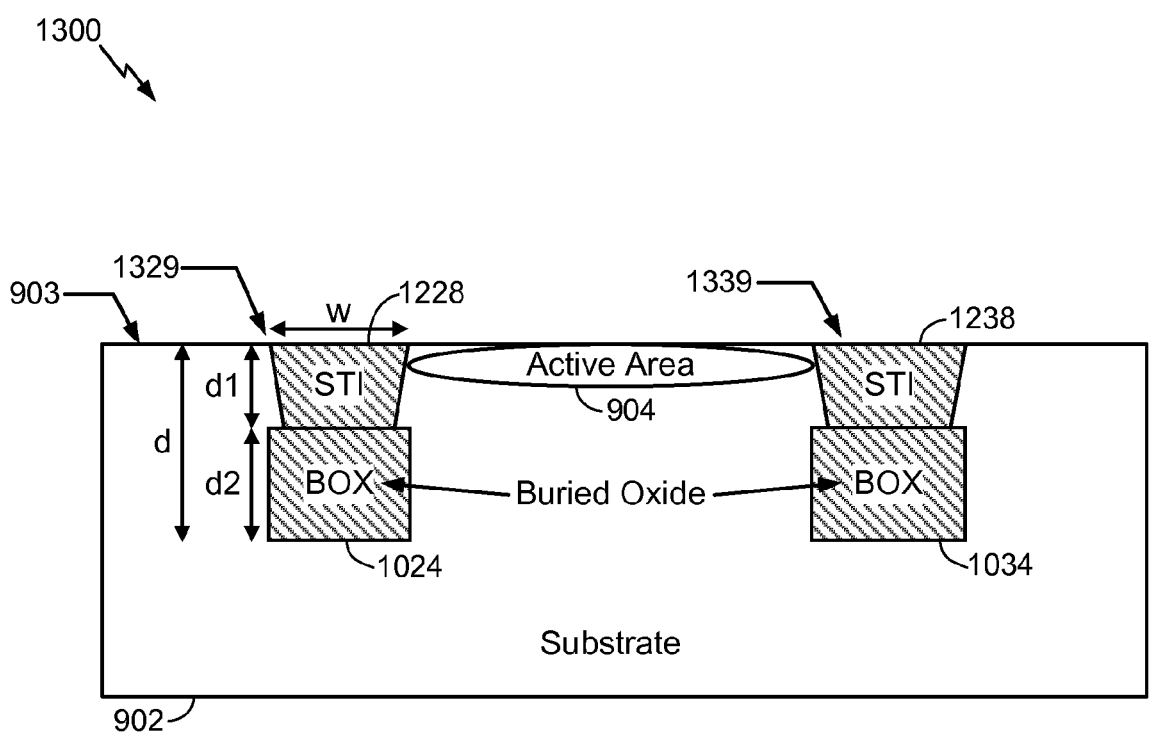
FIG. 13 is a diagram of a semiconductor product formed from the system 900 of FIG. 9 depicting isolation structures with a large effective aspect ratio.

FIG. 13 is a diagram of a semiconductor product formed form the system 900 of FIG. 9 depicting isolation structures with a large effective aspect ratio. The semiconductor product 1300 includes isolation structures 1329 and 1339 produced in accordance with FIGS. 9-12. In a particular embodiment, the semiconductor product 1300 may be formed by stripping masking layers of the system 1200 depicted in FIG. 12, removing the silicon nitride layer 908 and the oxide layer 906 from the surface 903 of the substrate 902.

The isolation structure 1329 includes the buried oxide (BOX) layer 1024 having a vertical height d2 and the top filling layer 1228 having a vertical height d1, resulting in an effective isolation depth d under the surface 903 of the substrate 902. The isolation structure 1339 includes the buried oxide (BOX) layer 1034 and the top filling layer 1238.

In a particular embodiment, an oxide barrier formed by the buried oxide layer 1024 or 1034 and the top filling layer 1228 or 1238 has an effective aspect ratio within a first range of approximately 5 to 6 with a narrow trench aspect ratio within a second range of approximately 3 to 4. For example, a ratio of the depth d+t (i.e., the combined thickness t depicted in FIG. 11 plus the depth d depicted in FIG. 13) to the width w of the isolation structure 1329 or 1339 may have a value in the range of 5 to 6. The effective aspect ratio of 5 to 6 may be obtained with a narrow trench aspect ratio (e.g., a ratio of the depth d1+t to the width w) within a range of 3 to 4. In another illustrative embodiment, an oxide barrier formed by the buried oxide layer 1024 or 1034 and the top filling layer 1228 or 1238 has an effective aspect ratio within a first range of approximately 3 to 4 with a narrow trench aspect ratio within a second range of approximately 1 to 2.

Figure 14:
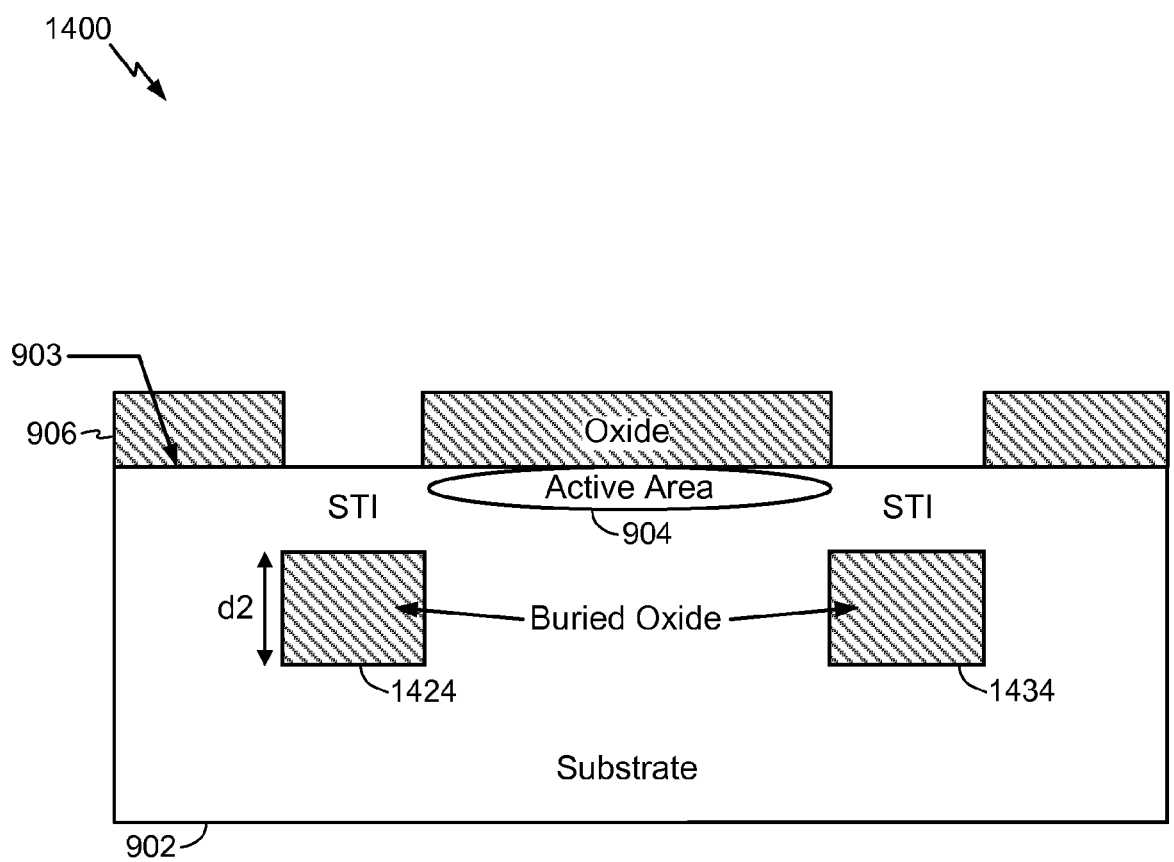
FIG. 14 is a diagram of a system formed from the system 900 of FIG. 9 after removing a silicon nitride layer and after performing an anneal.
Figure 15:
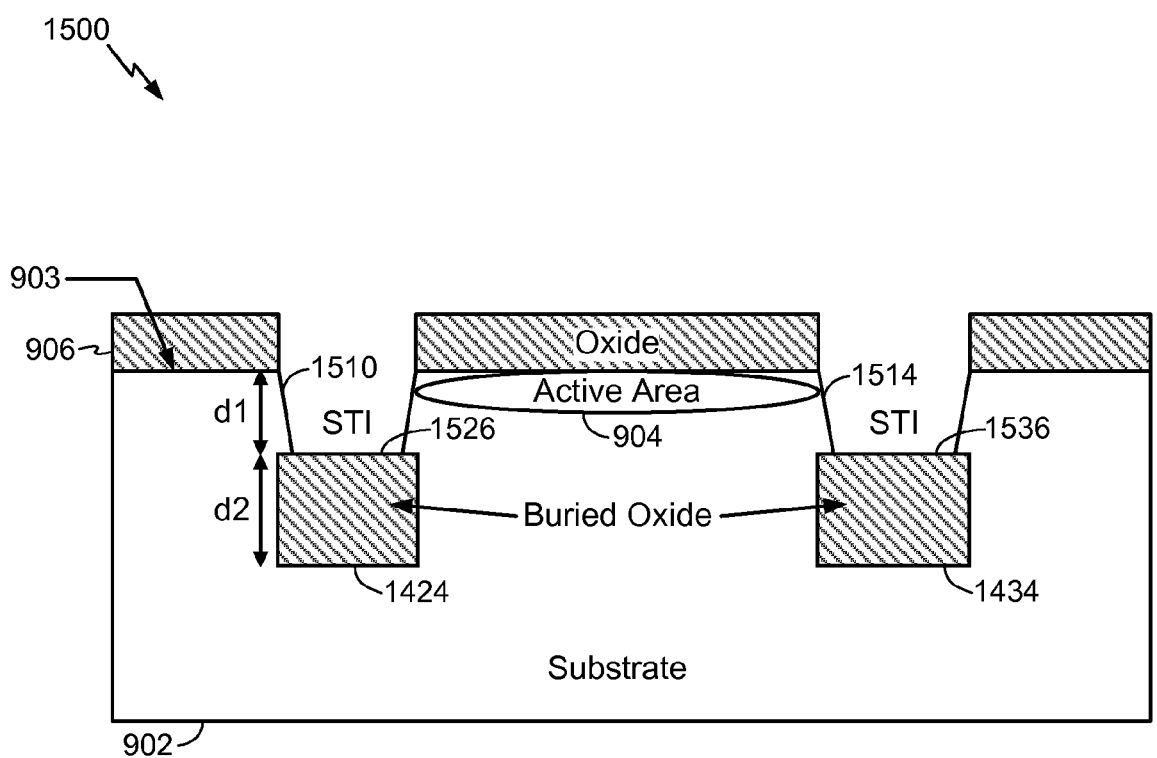
FIG. 15 is a diagram of a system formed from the system 1400 of FIG. 14 after etching narrow trenches to reach buried oxide layers.
Figure 16:
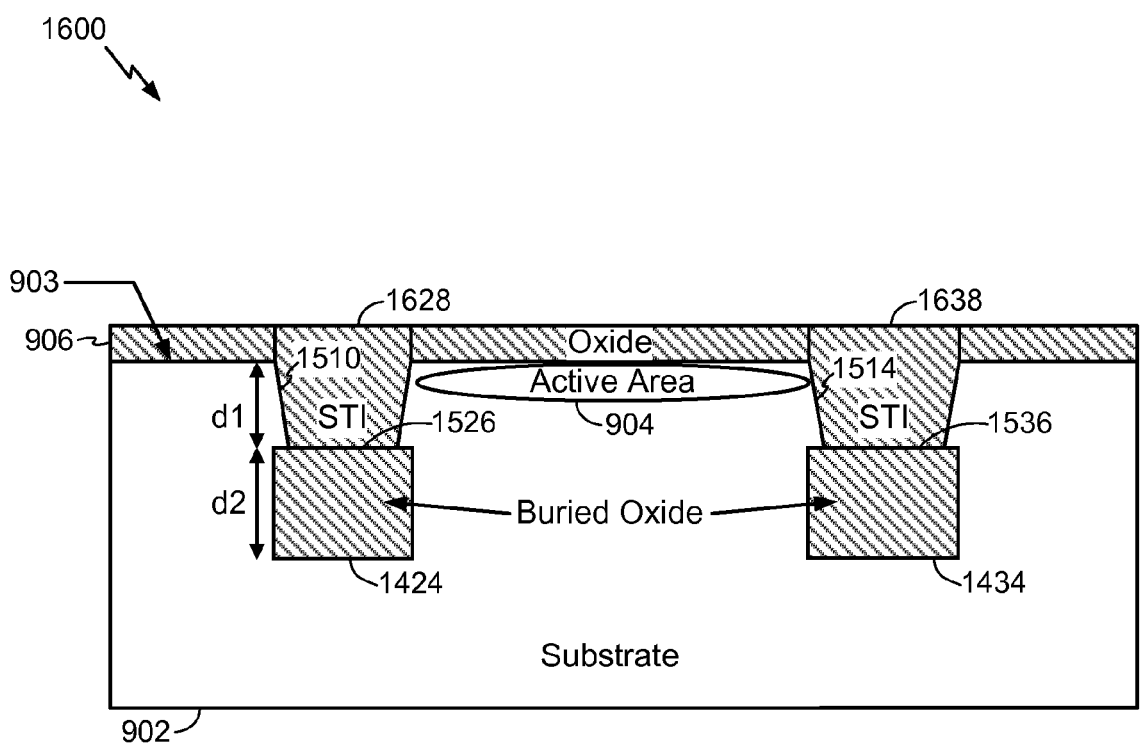
FIG. 16 is a diagram of a system formed from the system 1500 of FIG. 15 after depositing a filling material and a CMP process in the narrow trenches.

FIGS. 14-16 illustrate another embodiment of the self-aligned fabrication process of FIGS. 9-13 where the silicon nitride layer is removed prior to annealing. FIGS. 14-16 may be used in place of FIGS. 10-12, respectively.

FIG. 14 depicts a diagram of a system formed form the system 900 of FIG. 9 after removing a silicon nitride layer and after performing an anneal. The system 1400 includes the silicon substrate 902 having the surface 903, and the oxide layer 906. The active area 904 is formed in the silicon substrate 902. In contrast to FIG. 10, the silicon nitride layer 908 has been removed prior to performing a high-temperature anneal process.

The high-temperature anneal has formed buried oxide layers 1424 and 1434 of the implanted oxygen ions of the regions 920 and 930 depicted in FIG. 9, respectively. For example, the high-temperature anneal may be performed at around 1,300 degrees Celsius. The oxide layers 1424 and 1434 have a vertical dimension d2, corresponding to the vertical straggle areas 922 and 932 of the regions 920 and 930 of FIG. 9.

FIG. 15 is a diagram of a system formed form the system 1400 of FIG. 14 after etching narrow trenches to expose the buried oxide layers 1424 and 1434. The system 1500 includes the silicon substrate 902 having the surface 903, and the oxide layer 906. Narrow trenches 1510 and 1514 are adjacent to the active area 904 formed in the silicon substrate 902.

The narrow trenches 1510 and 1514 have been etched to reach the respective buried oxide layers 1424 and 1434. For example, a STI etch may have been performed using the oxide layer 906 as an etch mask. Material is removed from the silicon substrate 902 to expose at least a portion of a surface 1526 and 1536 of the buried oxide layers 1424 and 1436 under the trenches 1510 and 1514, respectively. The trenches 1510 and 1514 have a depth d1.

FIG. 16 is a diagram of a system formed form the system 1500 of FIG. 15 after depositing a filling material in the narrow trenches 1510 and 1514. The system 1600 includes the silicon substrate 902 having the surface 903, and the oxide layer 906. The narrow trenches 1510 and 1514 are adjacent to the active area 904 formed in the silicon substrate 902. A filing material has been deposited to form a top filling layer 1628 in the narrow trench 1510 and a top filling layer 1638 in the narrow trench 1514.

In a particular embodiment, the filling material that forms the top filling layers 1628 and 1638 is an oxide material having electrical isolation characteristics. The top filling layer 1628 extends from the surface 1526 of the buried oxide layer 1424 to above the surface 903 of the substrate 902. Similarly, the top filling layer 1638 extends from the surface 1536 of the buried oxide layer 1434 to above the surface 903 of the substrate 902.

After depositing the filling material, a reverse trench photo/etch process may remove extra filling material, and an oxide or isolation film chemical-mechanical planarization (CMP) may be performed and stopped at the oxide 906. Processing may continue in accordance with FIG. 13 to form the semi-conductor product 1300.

Figure 17:
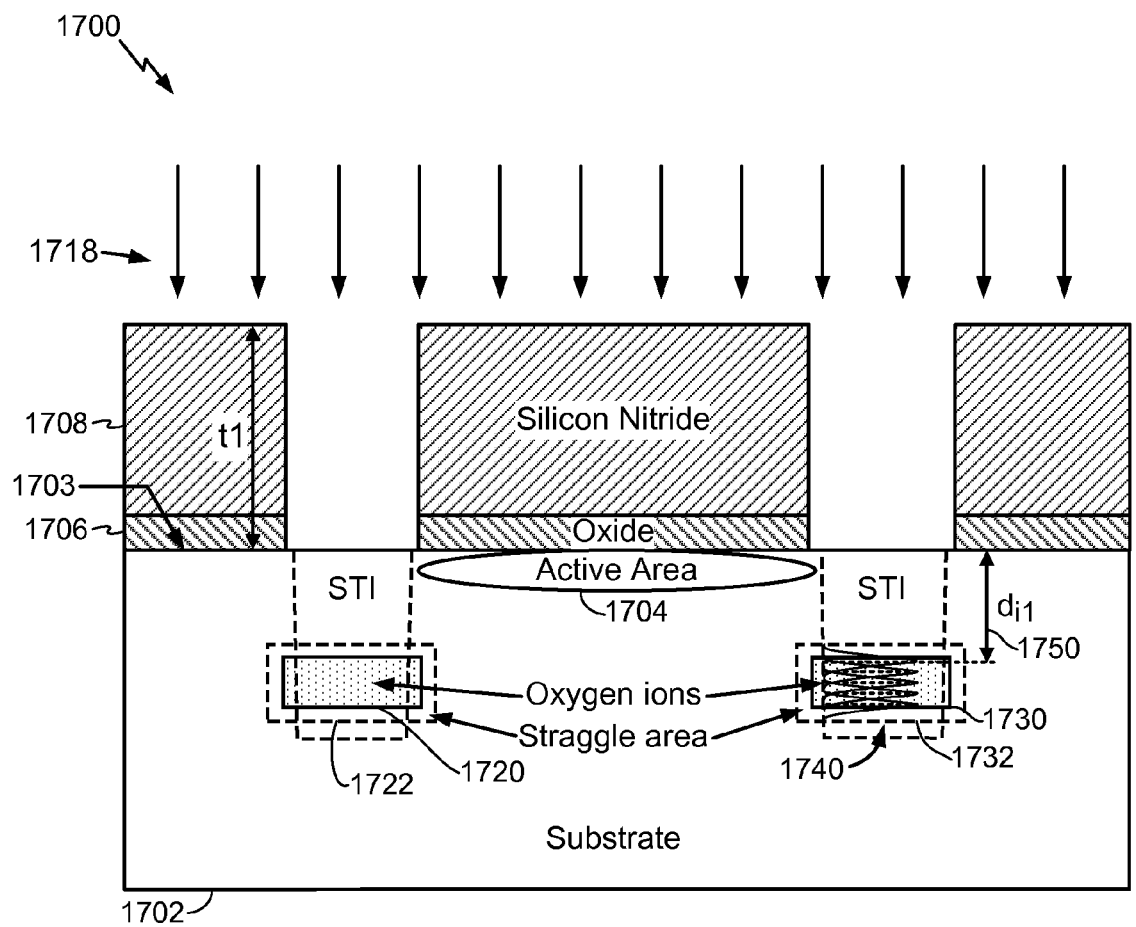
FIG. 17 is a diagram of a third illustrative embodiment of a system having a silicon substrate with oxygen implantation.

FIGS. 17-22 illustrate a first non-self-aligned fabrication process of isolation structures. FIG. 17 is a diagram of a third illustrative embodiment of a system having a silicon substrate with oxygen implantation. The system 1700 includes a silicon substrate 1702 having a surface 1703, an active area 1704 under an oxide layer 1706, and a silicon nitride layer 1708. The oxide layer 1706 and the silicon nitride layer 1708 may form a hardmask on the silicon substrate 1702 that defines an open region over oxygen-rich regions 1720 and 1730. For example, the oxide layer 1706 may be grown onto the silicon substrate 1702, and the silicon nitride layer 1708 may be deposited on the oxide layer 1706. A shallow trench isolation (STI) photolithography and etching process may be used to define a STI pattern in the oxide layer 1706 and the silicon nitride layer 1708.

Oxygen 1718 is implanted under a surface of the silicon substrate 1702 to form the oxygen-rich regions 1720 and 1730 of implanted oxygen ions. The oxide layer 1706 and the silicon nitride layer 1708 have a combined height t1. The combined height t1 may be determined so that the oxygen 1718 does not have sufficient implant energy to reach the silicon substrate 1702 through the silicon nitride layer 1708 and the oxide layer 1706. Thus, the combined layers 1706 and 1708 may act as an implantation mask to prevent oxygen implantation except into the oxygen-rich regions 1720 and 1730.

The oxygen 1718 may be implanted using multiple implant energies indicated by an implant distribution 1740 that is depicted within a straggle area 1732. The implant distribution 1740 includes a first implantation at a first implant energy of multiple implant energies to implant at a first mean depth $d_{i1}$ 1750. As discussed with respect to FIG. 1, the multiple implant energies enable a substantially uniform dose of oxygen ions within the straggle area 1732.

The implanted oxygen ions may exhibit "straggle" or spreading of the oxygen ions beyond the regions 1720 and 1730. The straggle may occur vertically (i.e., the direction indicated by height of the straggle area d2) or laterally (i.e., in a horizontal direction perpendicular to the direction of the height d2), indicated as straggle areas 1722 and 1732. Generally, lateral straggle and vertical straggle, as a percentage of implant depth, increases as the depth of implantation decreases. In a particular embodiment, the oxygen 1718 is implanted using a lowest implant energy of the multiple implant energies to result in a lateral straggle distance of the oxygen that is less than 35% of the mean implant depth $d_{i1}$ corresponding to the lowest implant energy. For example, the lowest implant energy may result in a mean implant depth $d_{i1}$ of at least a few hundred angstroms under the surface of the silicon substrate 1702. In a particular embodiment, the mean implant depth $d_{i1}$ may be within a range from 100 to 1000 angstroms, or more specifically 200-700 angstroms, or even more specifically 300-400 angstroms.

Figure 18:
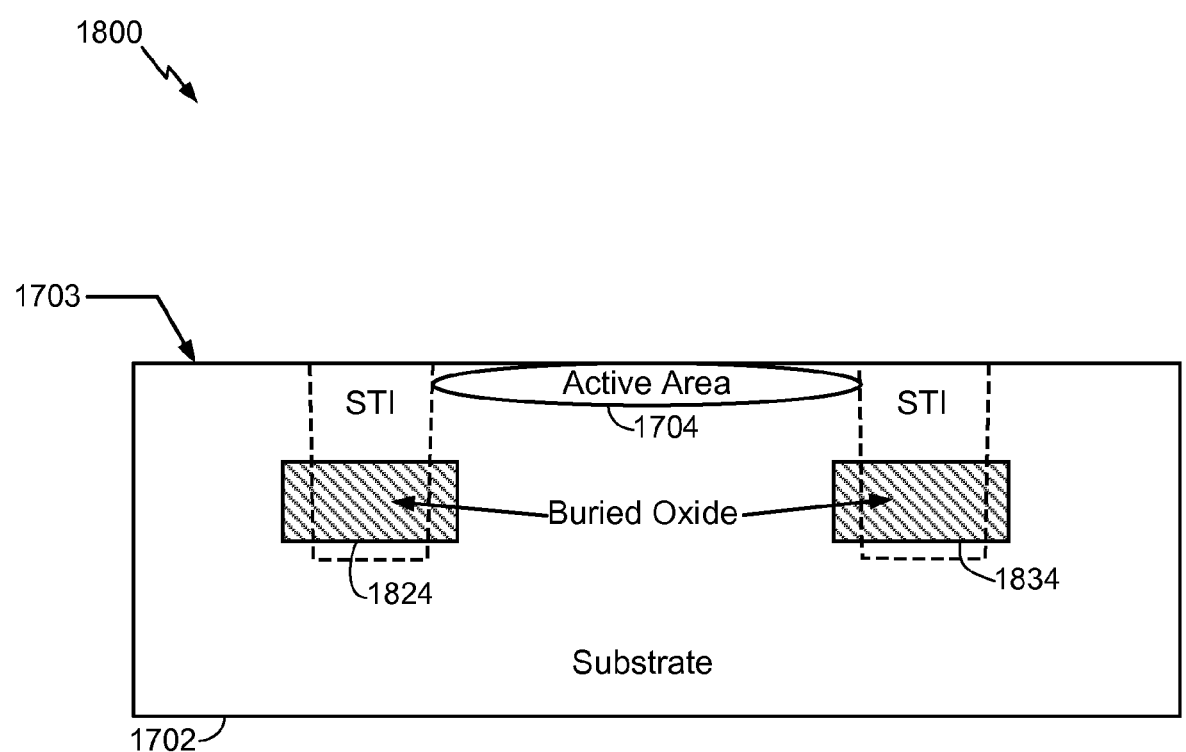
FIG. 18 is a diagram of a system formed from the system 1700 of FIG. 17 after removing a silicon nitride layer and after performing an anneal.

FIG. 18 is a diagram of a system formed form the system 1700 of FIG. 17 after performing an anneal. The system 1800 includes the silicon substrate 1702 having the surface 1703, with the oxide layer 1706 and the silicon nitride layer 1708 of FIG. 17 removed prior to the anneal. The active area 1704 is formed in the silicon substrate 1702.

A high-temperature anneal has formed buried oxide layers 1824 and 1834 of the implanted oxygen ions of the regions 1720 and 1730 depicted in FIG. 17, respectively. For example, the high-temperature anneal may be performed at around 1,300 degrees Celsius. The oxide layers 1824 and 1834 correspond to the vertical straggle areas 1722 and 1732 of the regions 1720 and 1730 of FIG. 17.

Figure 19:
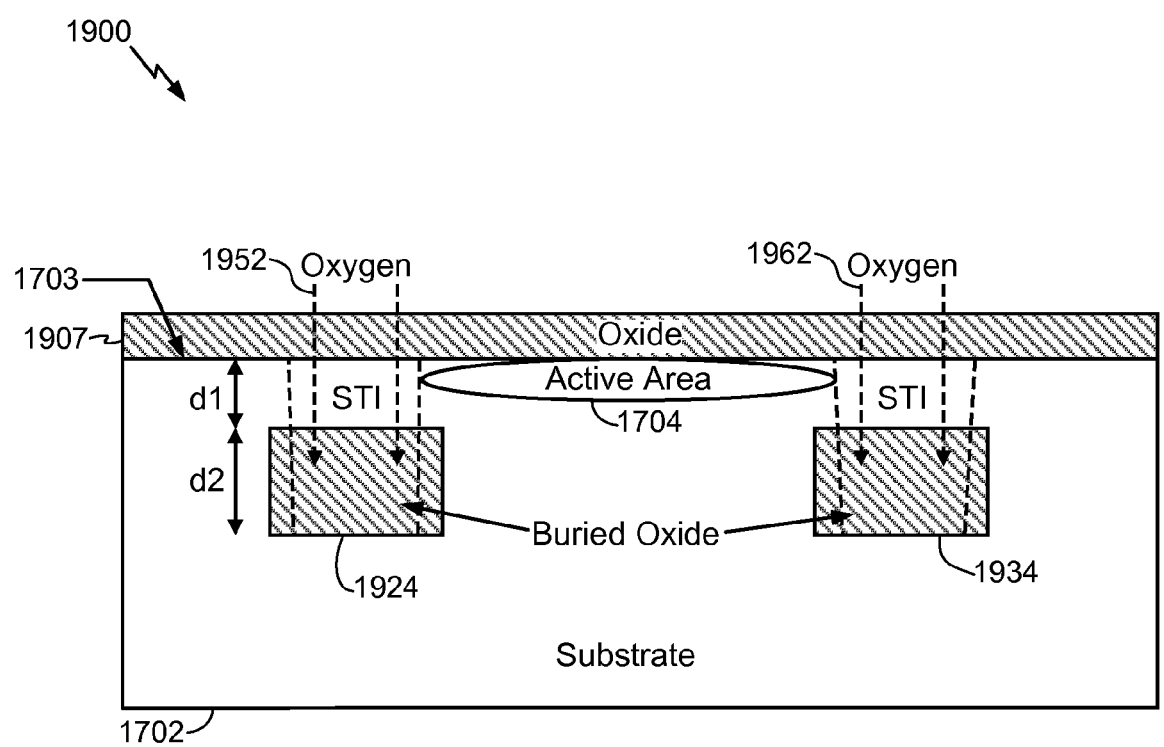
FIG. 19 is a diagram of a system formed from the system 1700 of FIG. 17 after removing a silicon nitride layer and performing an internal thermal oxidation (ITOX) anneal.

FIG. 19 is a diagram of a system formed from the system 1800 of FIG. 18 after performing an internal thermal oxidation (ITOX) anneal, as an optional process. FIG. 19 depicts a system 1900 that includes the silicon substrate 1702 having the surface 1703 and including the active area 1704. Another oxide layer 1907 has grown on the surface of the silicon substrate 1702 as a result of the ITOX anneal.

The high-temperature ITOX anneal has enhanced buried oxide layers 1824 and 1834 of FIG. 18 to form buried oxide layers 1924 and 1934, respectively. For example, the high-temperature ITOX anneal may be performed at a furnace in an oxygen-rich environment to enhance growth of the buried oxide layers 1824 and 1834 including additional oxygen 1952 and 1962. The ITOX method may result in thicker buried oxide layers 1924 and 1934, such as by a factor of two, as well as smoother surfaces and healing of pinholes in the buried oxide layers 1824 and 1834. The oxide layers 1924 and 1934 have a vertical dimension d2, which may be larger than the buried oxide layers 1824 and 1834 due to the ITOX process and additional oxygen 1952 and 1962.

Figure 20:
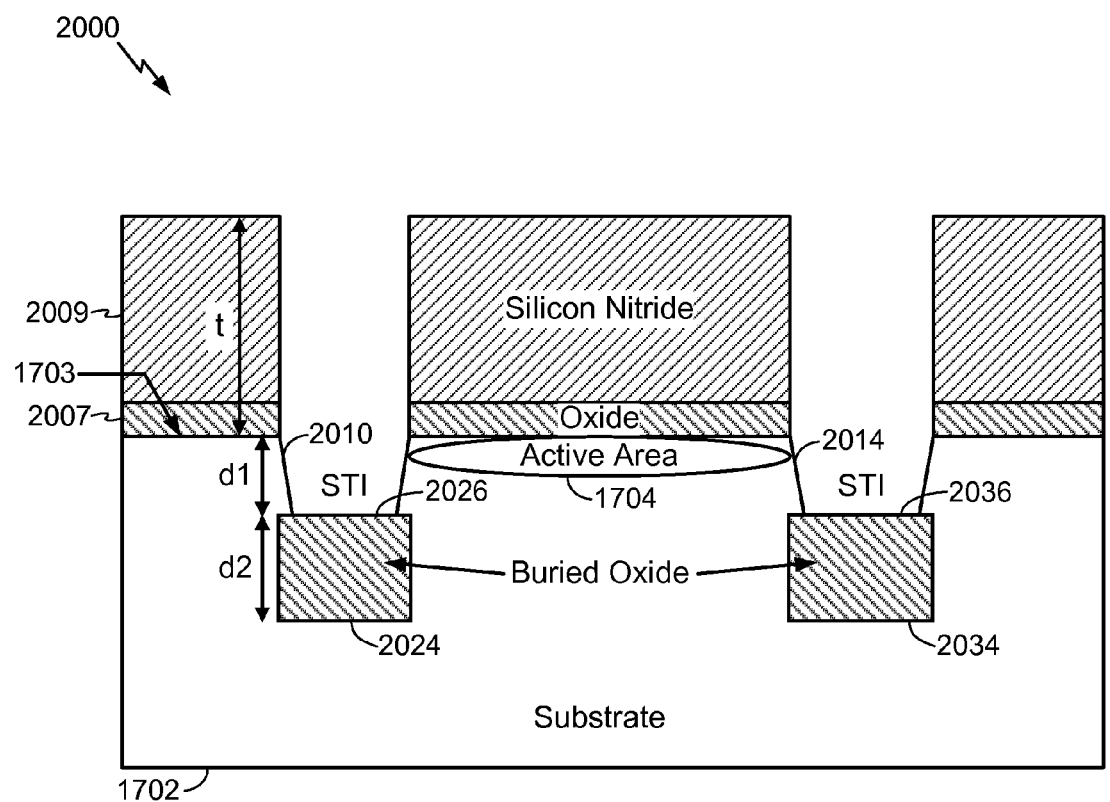
FIG. 20 is a diagram of a system formed from the system 1800 of FIG. 18 or the system 1900 of FIG. 19 after etching narrow trenches to expose buried oxide layers.

FIG. 20 is a diagram of a system formed form the system 1800 of FIG. 18 or the system 1900 of FIG. 19 after etching narrow trenches to expose buried oxide layers 2024 and 2034. The system 2000 includes the silicon substrate 1702 having the surface 1703, an oxide layer 2007, and a silicon nitride layer 2009. The active area 1704 is formed in the silicon substrate 1702. The oxide layer 2007 may be grown on the silicon substrate 1702 after the anneal of FIG. 18 or after removing the oxide layer 1907 of FIG. 19 resulting from the ITOX process. The silicon nitride layer 2009 may be deposited on the oxide layer 2007. The silicon nitride layer 2009 and the oxide layer 2007 may be processed via a STI photo/etch and patterned to form a hardmask. The buried oxide layers 2024 and 2034 may correspond to the buried oxide layers 1824 and 1834 of FIG. 18, or the buried oxide layers 1924 and 1934 of FIG. 19.

Narrow trenches 2010 and 2014 have been etched to reach the respective buried oxide layers 2024 and 2034. For example, a STI etch may have been performed using the oxide layer 2007 and the silicon nitride layer 2008 as etch masks. Material is removed from the silicon substrate 1702 to expose at least a portion of a surface 2026 and 2036 of the buried oxide layers 2024 and 2036, respectively. The trenches 2010 and 2014 have a depth d1.

Figure 21:
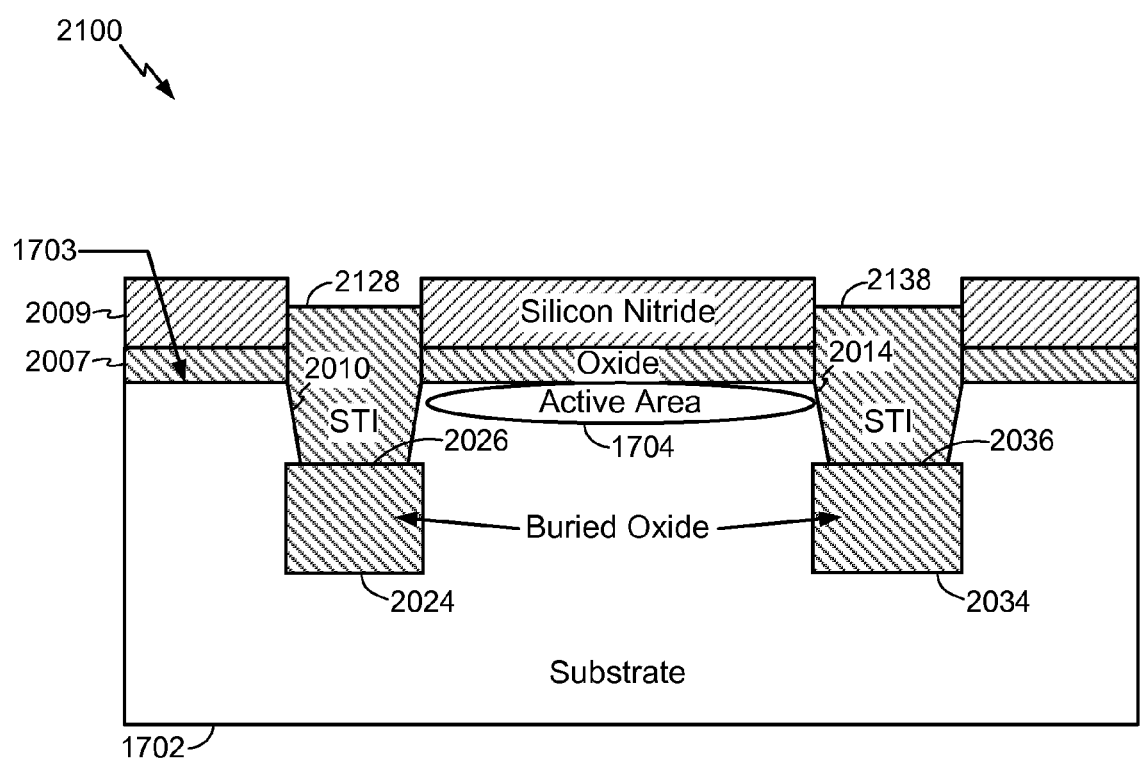
FIG. 21 is a diagram of a system formed from the system 2000 of FIG. 20 after depositing a filling material and a CMP process in the narrow trenches.

FIG. 21 is a diagram of a system formed form the system 2000 of FIG. 20 after depositing a filling material in the narrow trenches 2010 and 2014. The system 2100 includes the silicon substrate 1702 having the surface 1703, the oxide layer 2007, and the silicon nitride layer 2009. The narrow trenches 2010 and 2014 are adjacent to the active area 1704 formed in the silicon substrate 1702. A filling material has been deposited to form a top filling layer 2128 in the narrow trench 2010 and a top filling layer 2138 in the narrow trench 2014.

In a particular embodiment, the filling material that forms the top filling layers 2128 and 2138 is an oxide material having electrical isolation characteristics. The top filling layer 2128 extends from the surface 2026 of the buried oxide layer 2024 to above the surface 1703 of the substrate 1702. Similarly, the top filling layer 2138 extends from the surface 2036 of the buried oxide layer 2034 to above the surface 1703 of the substrate 1702.

After depositing the filling material, a reverse trench photo/etch process may remove extra filling material, and an oxide or isolation film chemical-mechanical planarization (CMP) may be performed and stopped at the silicon nitride layer 1708.

Figure 22:
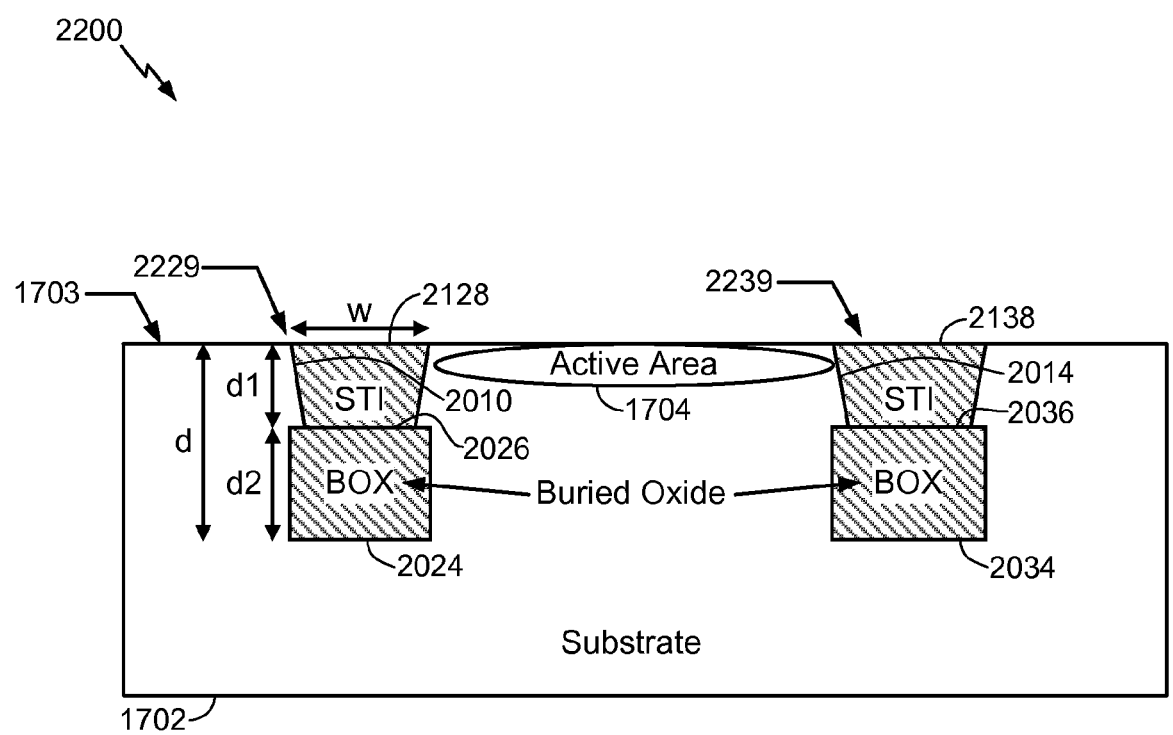
FIG. 22 is a diagram of a semiconductor product formed from the system 1700 of FIG. 17 depicting isolation structures with a large effective aspect ratio.

FIG. 22 is a diagram of a semiconductor product formed form the system 1700 of FIG. 17 depicting isolation structures with a large effective aspect ratio. The semiconductor product 2200 includes isolation structures 2229 and 2239 that may be produced in accordance with FIGS. 17-21. In a particular embodiment, the semiconductor product 2200 may be formed by removing the silicon nitride layer 2009 and the oxide layer 2007 from the surface 1703 of the substrate 1702 depicted in FIG. 21.

The isolation structure 2229 includes the buried oxide (BOX) layer 2024 having a vertical height d2 and the top filling layer 2128 having a vertical height d1, resulting in an effective isolation depth d under the surface 1703 of the substrate 1702. The isolation structure 2239 includes the buried oxide (BOX) layer 2034 and the top filling layer 2138.

In a particular embodiment, an oxide barrier formed by the buried oxide layer 2024 or 2034 and the top filling layer 2128 or 2138 has an effective aspect ratio within a first range of approximately 5 to 6 with a narrow trench aspect ratio within a second range of approximately 3 to 4. For example, a ratio of the depth d+t (i.e., the combined height t depicted in FIG. 20 plus the depth d depicted in FIG. 22) to the width w of the isolation structure 2229 or 2239 may have a value in the range of 5 to 6. The effective aspect ratio of 5 to 6 may be obtained with a narrow trench aspect ratio (e.g., a ratio of the depth d1+t to the width w) within a range of 3 to 4. In another illustrative embodiment, an oxide barrier formed by the buried oxide layer 1824 or 1834 and the top filling layer 2128 or 2138 has an effective aspect ratio within a first range of approximately 3 to 4 with a narrow trench aspect ratio within a second range of approximately 1 to 2.

Figure 23:
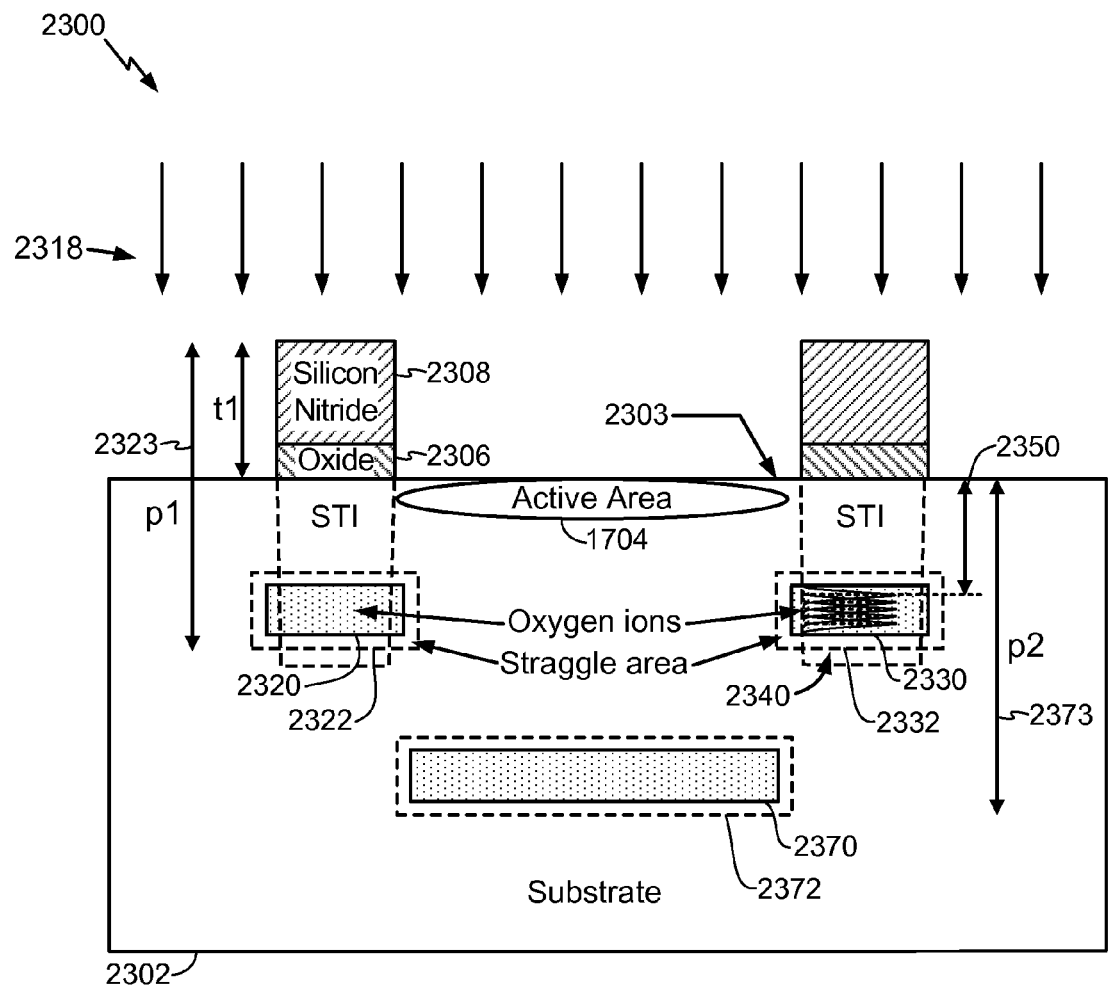
FIG. 23 is a diagram of a fourth illustrative embodiment of a system having a silicon substrate with oxygen implantation.

FIGS. 23-28 illustrate a second non-self-aligned fabrication process of isolation structures. FIG. 23 is a diagram of a fourth illustrative embodiment of a system having a silicon substrate with oxygen implantation. The system 2300 includes a silicon substrate 2302 having an active area 2304 under a surface 2303 of the silicon substrate 2302. An oxide layer 2306 and a silicon nitride layer 2308 are patterned on the surface of the silicon substrate 2302. The oxide layer 2306 and the silicon nitride layer 2308 may form a hardmask on the silicon substrate 2302 that affects an implantation depth into the silicon substrate 2302. The hardmask formed by the oxide layer 2306 and the silicon nitride layer 2308 is present over oxygen-rich regions 2320 and 2330 and has an open region over the active area 2304 and a representative deeply buried oxygen-rich region 2370. For example, the oxide layer 2306 may be grown onto the silicon substrate 2302, and the silicon nitride layer 2308 may be deposited on the oxide layer 2306. A photolithography and etching process may be used to define a pattern in the oxide layer 2306 and the silicon nitride layer 2308.

Oxygen 2318 is implanted under a surface of the silicon substrate 2302 to form the oxygen-rich regions 2370, 2320 and 2330 of implanted oxygen ions. The oxide layer 2306 and the silicon nitride layer 2308 have a combined height t1. The combined height t1 may be determined so that the oxygen 2318 implants a depth p1 2323 through the silicon nitride layer 2308 and the oxide layer 2306 and into the silicon substrate 2302 to from the oxygen-rich regions 2320 and 2330 adjacent to the active area 2304. Where the hardmask forms an opening, such as over the active area, the oxygen 2318 may be implanted to a depth p2 within the silicon substrate 2302.

The oxygen 2318 may be implanted using multiple implant energies indicated by an implant distribution 2340 that is depicted within a straggle area 2332. The implant distribution 2340 includes a first implantation at a first implant energy of multiple implant energies to implant through the silicon nitride layer 2308, the oxide layer 2306 and into the silicon substrate 2302 at a first mean depth 2350 from the surface of the silicon substrate 2302. As discussed with respect to FIG. 1, the multiple implant energies enable a substantially uniform dose of oxygen ions within the straggle area 2332.

The implanted oxygen ions may exhibit "straggle" or spreading of the oxygen ions beyond the regions 2370, 2320 and 2330. The straggle may occur vertically (i.e., the direction indicated by height of the straggle area d2) or laterally (i.e., in a horizontal direction perpendicular to the direction of the height d2), indicated as straggle areas 2372, 2322 and 2332. Generally, lateral straggle and vertical straggle, as a proportion of implant depth, increases as the depth of implantation decreases. In a particular embodiment, the oxygen 2318 is implanted using a lowest implant energy of the multiple implant energies to result in a lateral straggle distance of the oxygen that is less than 35% of the mean implant depth corresponding to the lowest implant energy. For example, the lowest implant energy may result in a mean implant depth 2350 of at least few hundred angstroms under the surface of the silicon substrate 2302 for the regions 2320 and 2330 and a mean implant depth p2 2373 for the region 2370. The multiple implant energies may be determined so that the deeply buried oxygen-rich region 2370 is sufficiently distant from the active area 2304 to have minimal impact on device operation, and further to ensure that no overlap occurs between the buried oxide layers that will be formed from the oxygen-rich regions 2370, 2320, and 2330, as will be discussed with respect to FIGS. 24 and 25. Although a single deeply buried oxygen rich region 2370 is depicted, other deeply buried oxygen rich regions may also be formed due to oxygen implantation in areas not masked by the layers 2306 and 2308.

Figure 24:
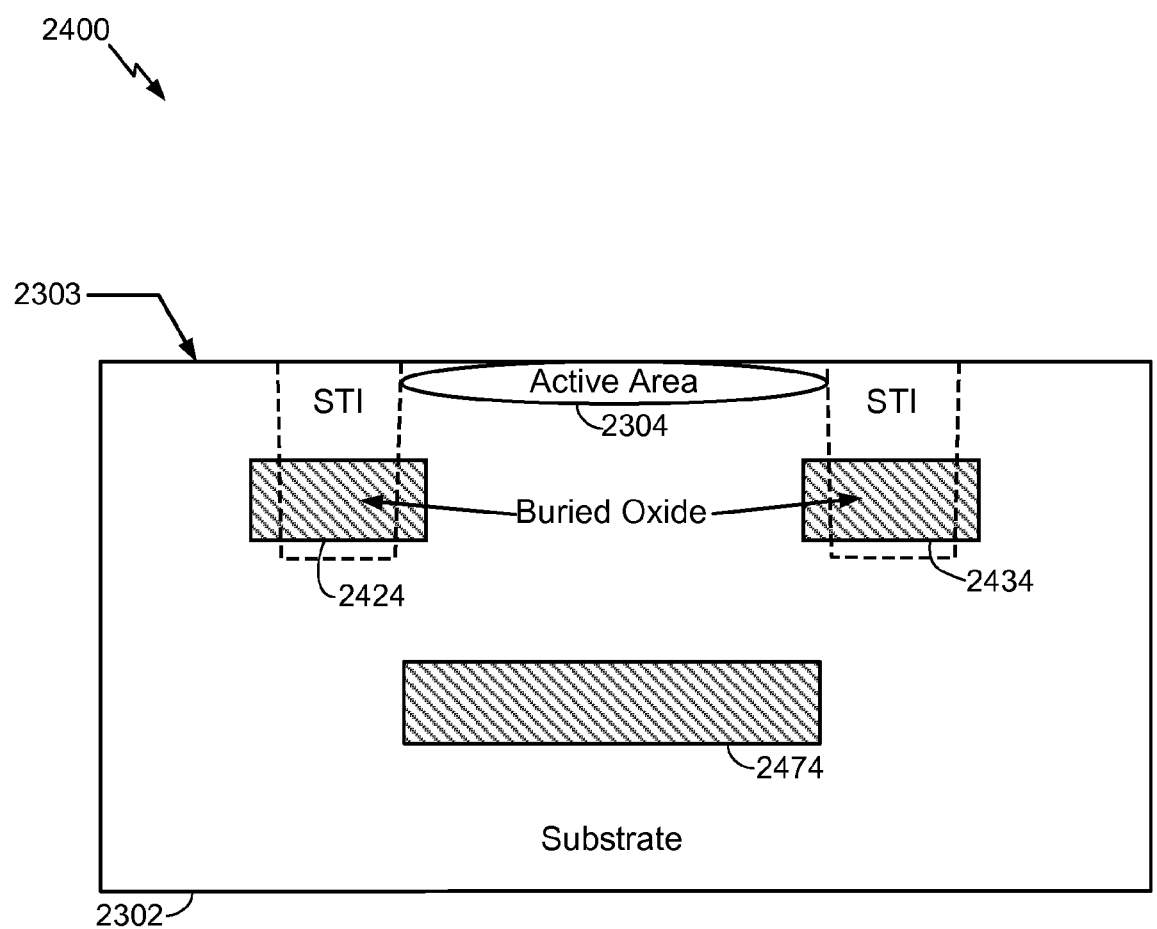
FIG. 24 is a diagram of a system formed from the system 2300 of FIG. 23 after removing a silicon nitride layer and after performing an anneal.

FIG. 24 is a diagram of a system formed form the system 2300 of FIG. 23 after performing an anneal. The system 2400 includes the silicon substrate 2302 with the oxide layer 2306 and the silicon nitride layer 2308 of FIG. 23 removed prior to the anneal. The active area 2304 is formed under the surface 2303 of the silicon substrate 2302. A high-temperature anneal has formed buried oxide layers 2424 and 2434 of the implanted oxygen ions of the regions 2320 and 2330 depicted in FIG. 23, respectively, and a deeply buried oxide layer 2474 of the implanted oxygen ions of the region 2370. For example, the high-temperature anneal may be performed at around 1,300 degrees Celsius.

Figure 25:
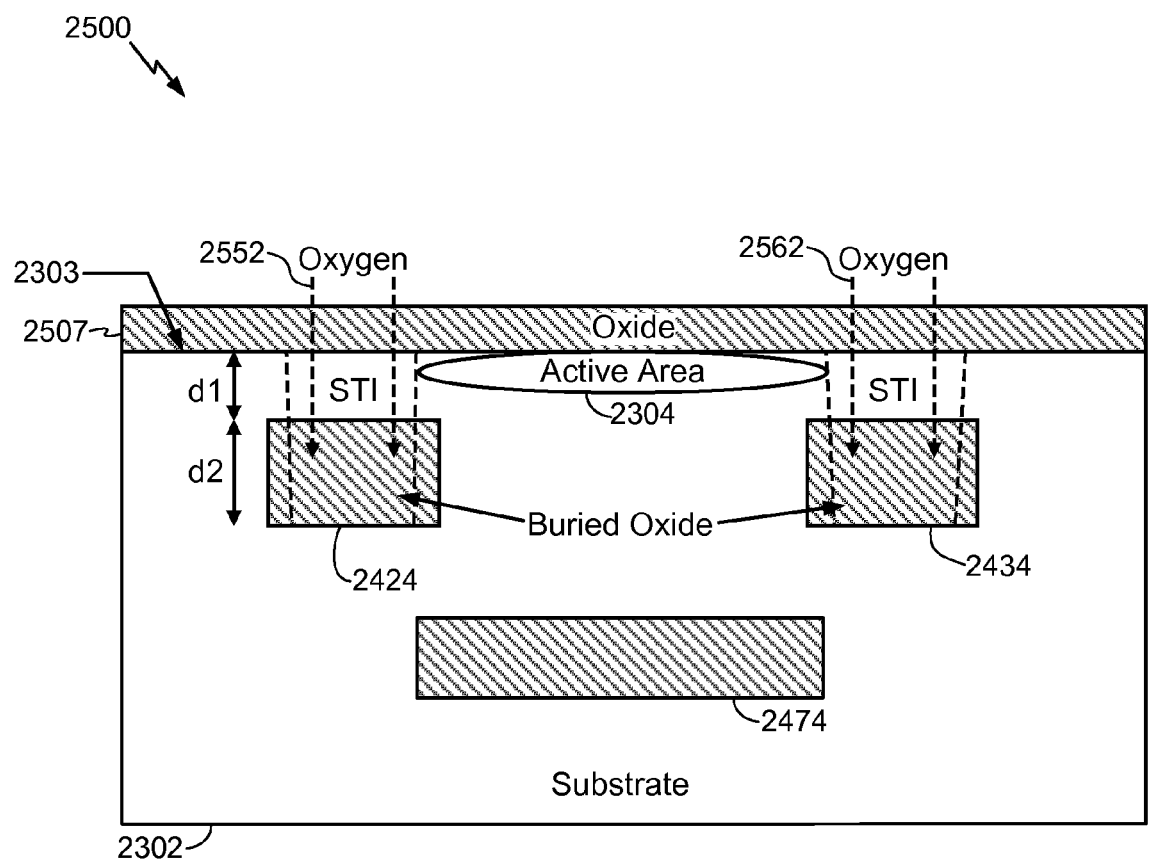
FIG. 25 is a diagram of a system formed from the system 2300 of FIG. 23 after removing a silicon nitride layer and performing an internal thermal oxidation (ITOX) anneal.

FIG. 25 is a diagram of a system formed form the system 2400 of FIG. 24 after performing an internal thermal oxidation (ITOX) anneal, as an optional process. FIG. 25 depicts a system 2500 that includes the silicon substrate 2302 including the active area 2304. Another oxide layer 2507 has grown on the surface 2303 of the silicon substrate 2302 as a result of the ITOX anneal.

The high-temperature ITOX anneal has enhanced the buried oxide layers 2424 and 2434. The ITOX method may result in thicker buried oxide layers 2424 and 2434, such as by a factor of two, as well as smoother surfaces and the healing of pinholes in the buried oxide layers 2424 and 2434. The oxide layers 2424 and 2434 have a vertical dimension d2, at a depth d1 from the surface of the silicon substrate 2302.

Figure 26:
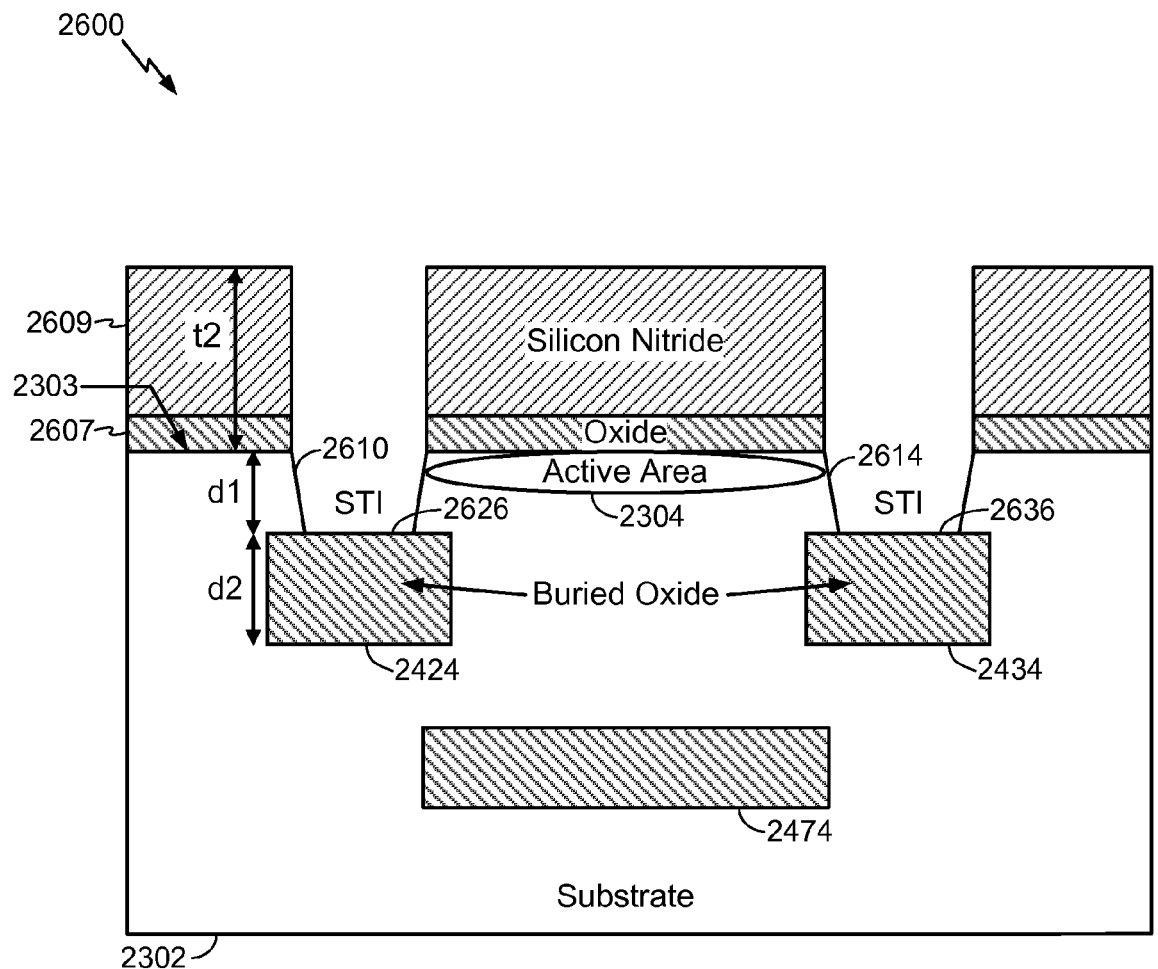
FIG. 26 is a diagram of a system formed from the system 2400 of FIG. 24 or the system 2500 of FIG. 25 after etching narrow trenches to reach buried oxide layers.

FIG. 26 is a diagram of a system formed form the system 2400 of FIG. 24 or the system 2500 of FIG. 25 after etching narrow trenches to expose buried oxide layers 2424 and 2434. The system 2600 includes the silicon substrate 2302, an oxide layer 2607, and a silicon nitride layer 2609. The active area 2304 is formed in the silicon substrate 2302. The oxide layer 2607 may be grown on the surface 2303 the silicon substrate 2302 after the anneal of FIG. 24 or after removing the oxide layer 2507 of FIG. 25 resulting from the ITOX process. The silicon nitride layer 2609 may be deposited on the oxide layer 2607. The silicon nitride layer 2609 and the oxide layer 2607 may be processed via a STI photo/etch and patterned to form a STI hardmask having a thickness t2.

Narrow trenches 2610 and 2614 have been etched to reach the respective buried oxide layers 2424 and 2434. For example, a STI etch may use the oxide layer 2607 and the silicon nitride layer 2609 as etch masks. Material is removed from the silicon substrate 2302 to expose at least a portion of a surface 2626 and 2636 of the buried oxide layers 2624 and 2636, respectively.

Figure 27:
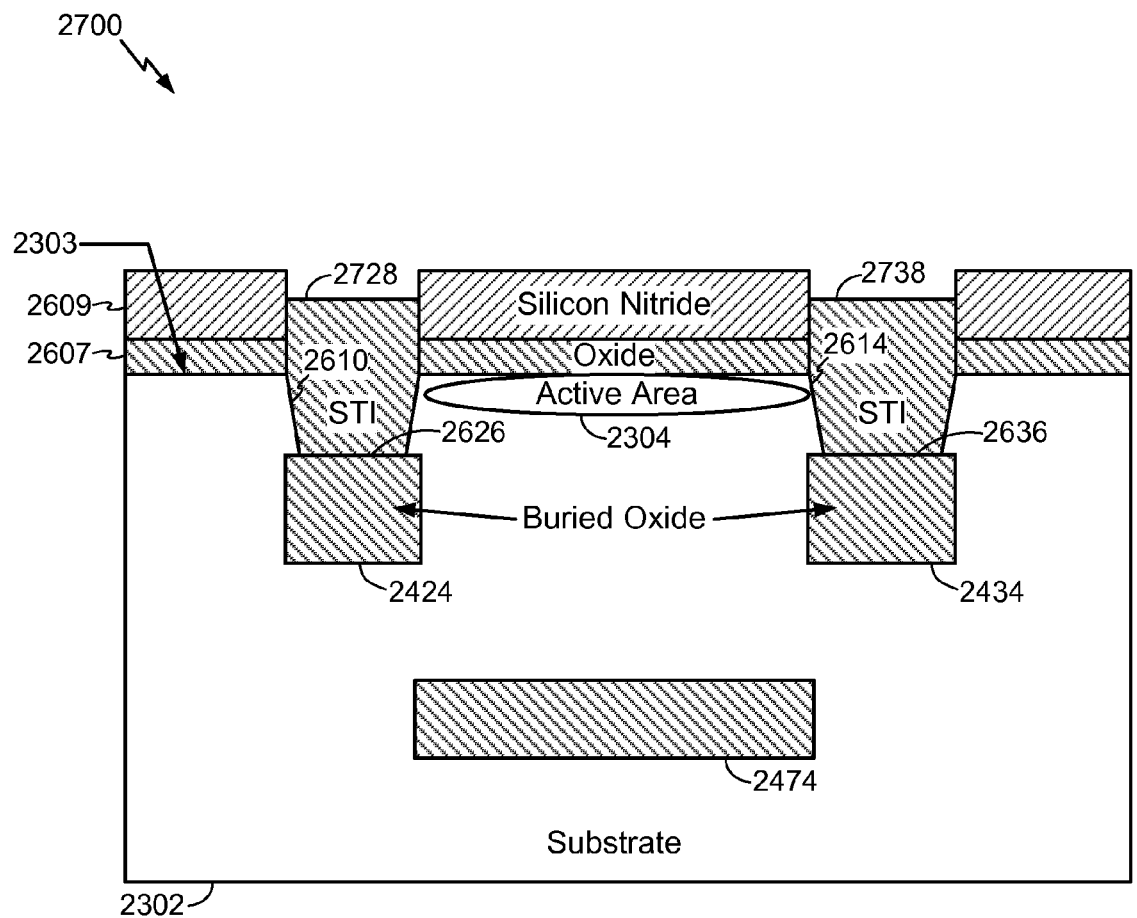
FIG. 27 is a diagram of a system formed from the system 2600 of FIG. 26 after depositing a filling material and a CMP process in the narrow trenches.

FIG. 27 is a diagram of a system formed form the system 2600 of FIG. 26 after depositing a filling material in the narrow trenches 2610 and 2614. The system 2700 includes the silicon substrate 2302 having the surface 2303, the oxide layer 2607, and the silicon nitride layer 2609. The narrow trenches 2610 and 2614 are adjacent to the active area 2304 formed in the silicon substrate 2302. A filling material has been deposited to form a top filling layer 2728 in the narrow trench 2610 and a top filling layer 2738 in the narrow trench 2614.

In a particular embodiment, the filling material that forms the top filling layers 2728 and 2738 is an oxide material having electrical isolation characteristics. The top filling layer 2728 extends from the surface 2626 of the buried oxide layer 2424 to above the surface 2303 of the substrate 2302. Similarly, the top filling layer 2738 extends from the surface 2636 of the buried oxide layer 2434 to above the surface 2303 of the substrate 2302.

After depositing the filling material, a reverse trench photo/etch process may remove extra filling material, and an oxide or isolation film chemical-mechanical planarization (CMP) may be performed and stopped at the silicon nitride layer 2609.

Figure 28:
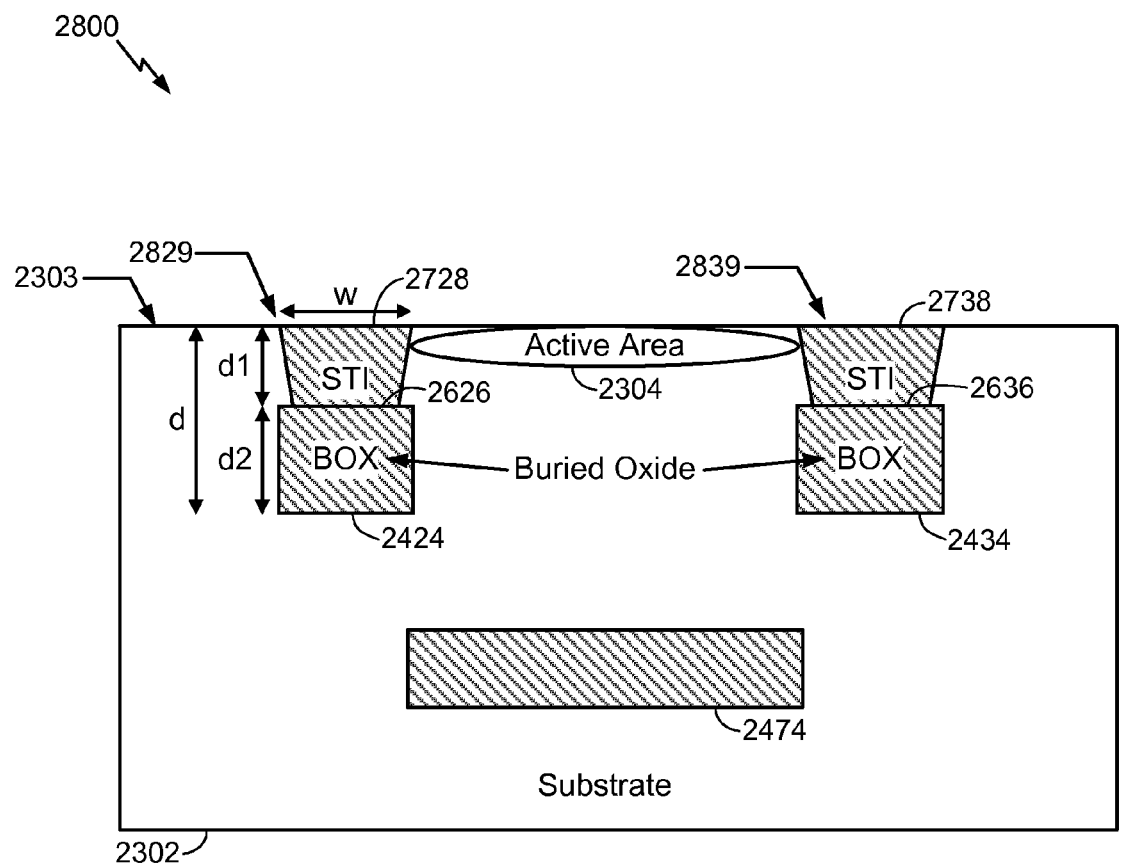
FIG. 28 is a diagram of a semiconductor product formed from the system 2300 of FIG. 23 depicting isolation structures with a large effective aspect ratio.

FIG. 28 is a diagram of a semiconductor product formed form the system 2300 of FIG. 23 depicting isolation structures with a large effective aspect ratio. The semiconductor product 2800 includes isolation structures 2829 and 2839 produced in accordance with FIGS. 23-27. In a particular embodiment, the semiconductor product 2800 may be formed from the system 2700 depicted in FIG. 27 by removing the silicon nitride layer 2609 and the oxide layer 2607 from the surface 2303 of the substrate 2302. The isolation structures 2829 and 2839 are adjacent to the active area 2304. The deeply buried oxide layer 2474 is under the active area.

The isolation structure 2829 includes the buried oxide (BOX) layer 2424 having a vertical height d2 and the top filling layer 2728 extending from a surface 2626 of the BOX layer 2424 to the surface of the silicon substrate 2303 and having a vertical height d1, resulting in an effective isolation depth d under the surface 2303 of the substrate 2302. The isolation structure 2839 includes the buried oxide (BOX) layer 2434 and the top filling layer 2738 extending from a surface 2636 of the BOX layer 2434 to the surface of the silicon substrate 2303.

In a particular embodiment, an oxide barrier formed by the buried oxide layer 2424 or 2434 and the top filling layer 2728 or 2738 has an effective aspect ratio within a first range of approximately 5 to 6 with a narrow trench aspect ratio within a second range of approximately 3 to 4. For example, a ratio of the depth d+t2 (i.e., the combined height t2 depicted in FIG. 26 plus the depth d depicted in FIG. 28) to the width w of the isolation structure 2829 or 2839 may have a value in the range of 5 to 6. The effective aspect ratio of 5 to 6 may be obtained with a narrow trench aspect ratio (e.g., a ratio of the depth d1+t2 to the width w) within a range of 3 to 4. In another illustrative embodiment, an oxide barrier formed by the buried oxide layer 2424 or 2434 and the top filling layer 2728 or 2738 has an effective aspect ratio within a first range of approximately 3 to 4 with a narrow trench aspect ratio within a second range of approximately 1 to 2.

Figure 29:
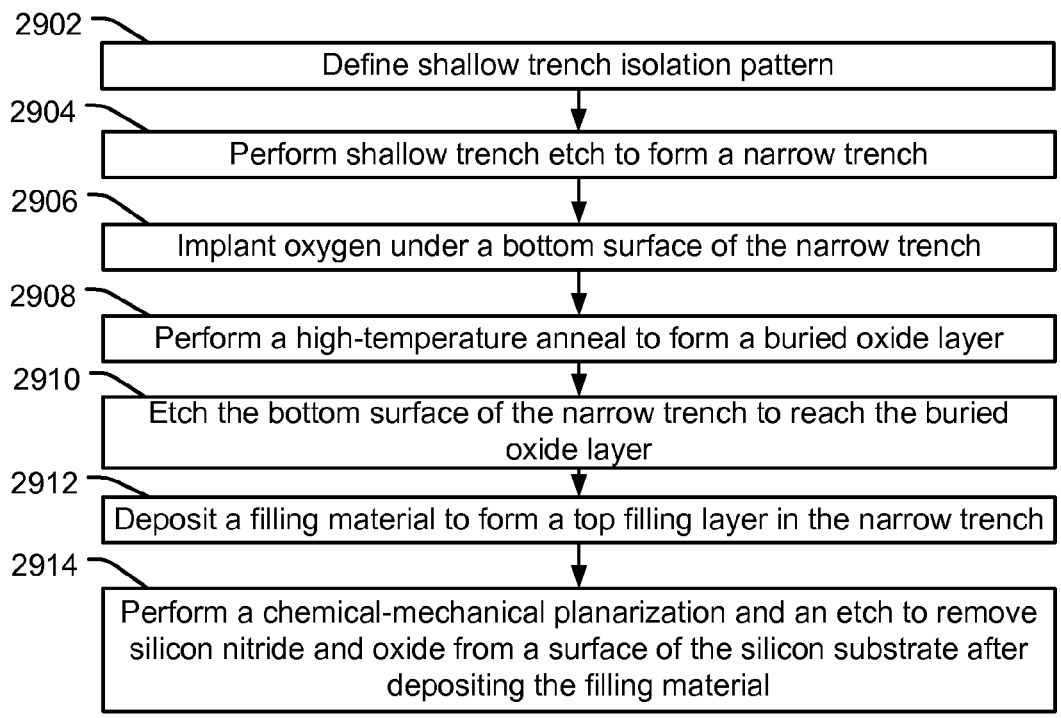
FIG. 29 is a flow chart of a first particular embodiment of a method of forming an isolation structure.

FIG. 29 is a flow chart of a first particular embodiment of a method of forming an isolation structure. In a particular embodiment, the method corresponds to FIGS. 1-5. A shallow trench isolation pattern may be defined in an oxide layer and a silicon nitride layer, at 2902. Moving to 2904, a shallow trench etch may be performed to form a narrow trench before implanting oxygen. The narrow trench may have a width that is less than 70 nm.

Proceeding to 2906, oxygen is implanted under a bottom surface of a narrow trench of a silicon substrate. In a particular embodiment, the oxygen is implanted using multiple implant energies. A lowest implant energy of the multiple implant energies may result in a mean implant depth of at least few hundred angstroms under the bottom surface of the narrow trench. The lowest implant energy of the multiple implant energies may result in a lateral straggle distance of the oxygen that is less than 35% of a mean implant depth corresponding to the lowest implant energy.

Advancing to 2908, a high-temperature anneal of the silicon substrate and the oxygen is performed to form a buried oxide layer. Continuing to 2910, the bottom surface of the narrow trench is etched to reach the buried oxide layer. Moving to 2912, a filling material is deposited to form a top filling layer in the narrow trench. The filling material may be an oxide material. Proceeding to 2914, a chemical-mechanical planarization (CMP) process and an etch may be performed to remove silicon nitride and oxide from a surface of the silicon substrate after depositing the filing material.

In a particular embodiment, an oxide barrier formed by the buried oxide layer and the top filling layer has an effective aspect ratio within a first range of approximately 5 to 6 with a narrow trench aspect ratio within a second range of approximately 3 to 4, including a thickness of the silicon nitride. In another particular embodiment, an oxide barrier formed by the buried oxide layer and the top filling layer has an effective aspect ratio within a first range of approximately 3 to 4 with a narrow trench aspect ratio within a second range of approximately 1 to 2.

Figure 30:
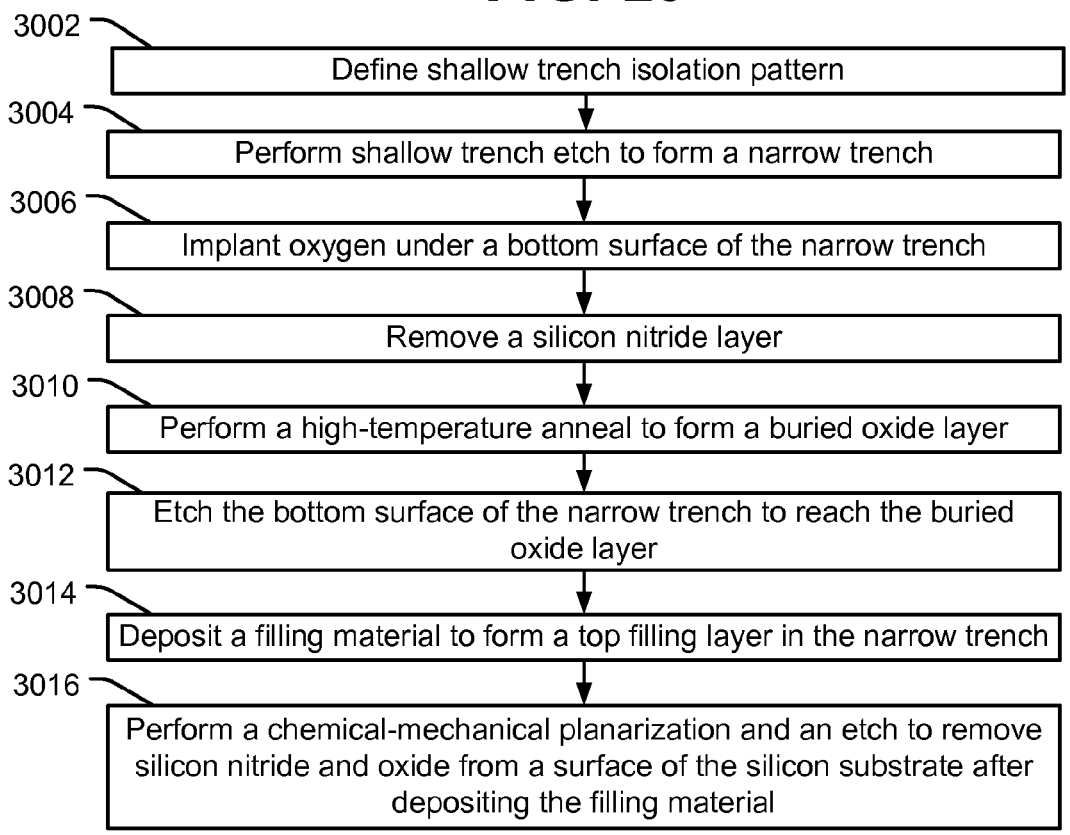
FIG. 30 is a flow chart of a second particular embodiment of a method of forming an isolation structure.

FIG. 30 is a flow chart of a second particular embodiment of a method of forming an isolation structure. In a particular embodiment, the method corresponds to FIGS. 1, 6, 7, 8, and 5. A shallow trench isolation pattern may be defined in an oxide layer and a silicon nitride layer, at 3002. Moving to 3004, a shallow trench etch may be performed to form a narrow trench before implanting oxygen. The narrow trench may have a width that is less than 70 nm.

Proceeding to 3006, oxygen is implanted under a bottom surface of a narrow trench of a silicon substrate. In a particular embodiment, the oxygen is implanted using multiple implant energies. A lowest implant energy of the multiple implant energies may result in a mean implant depth of at least few hundred angstroms under the bottom surface of the narrow trench. In a particular embodiment, the mean implant depth may be within a range from 100 to 1000 angstroms, or more specifically 200-700 angstroms, or even more specifically 300-400 angstroms. The lowest implant energy of the multiple implant energies may result in a lateral straggle distance of the oxygen that is less than 35% of a mean implant depth corresponding to the lowest implant energy.

Advancing to 3008, a silicon nitride layer may be removed before performing a high-temperature anneal. Continuing to 3010, a high-temperature anneal of the silicon substrate and the oxygen is performed to form a buried oxide layer. Moving to 3012, the bottom surface of the narrow trench is etched to reach the buried oxide layer. Proceeding to 3014, a filling material is deposited to form a top filling layer in the narrow trench. The filling material may be an oxide material. Advancing to 3016, a chemical-mechanical planarization (CMP) process and an etch may be performed to remove silicon nitride and oxide from a surface of the silicon substrate after depositing the filing material.

In a particular embodiment, an oxide barrier formed by the buried oxide layer and the top filling layer has an effective aspect ratio within a first range of approximately 5 to 6 with a narrow trench aspect ratio within a second range of approximately 3 to 4, including a thickness of the silicon nitride. In another particular embodiment, an oxide barrier formed by the buried oxide layer and the top filling layer has an effective aspect ratio within a first range of approximately 3 to 4 with a narrow trench aspect ratio within a second range of approximately 1 to 2.

Figure 31:
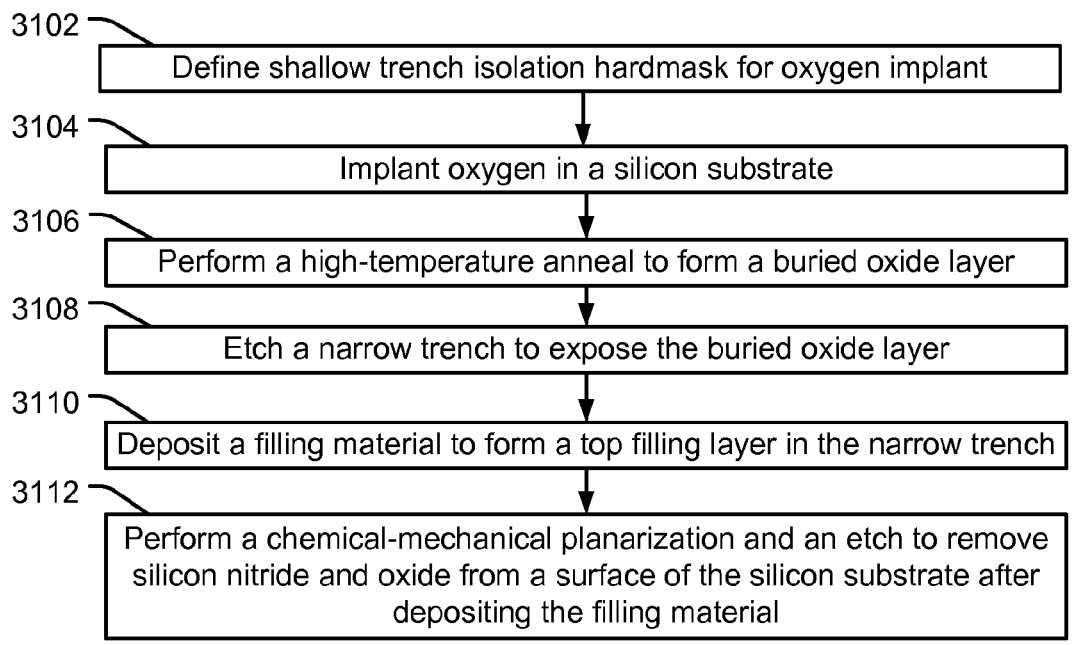
FIG. 31 is a flow chart of a third particular embodiment of a method of forming an isolation structure.

FIG. 31 is a flow chart of a third particular embodiment of a method of forming an isolation structure. In a particular embodiment, the method corresponds to FIGS. 9-13. At 3102, a shallow trench isolation hardmask is defined for an oxygen implant. For example, silicon nitride material may be deposited to form a silicon nitride layer on the silicon substrate and a shallow trench may be patterned before implanting the oxygen layer.

Moving to 3104, oxygen is implanted into a silicon substrate. Proceeding to 3106, a high-temperature anneal of the silicon substrate having the implanted oxygen is performed to form a substrate with a buried oxide layer. Advancing to 3108, a narrow trench is etched in a surface of the silicon substrate to expose the buried oxide layer. Continuing to 3110, a filling material is deposited into the trench to form a top filling layer in the narrow trench. Moving to 3112, a chemical-mechanical planarization and an etch may be performed to remove silicon nitride and oxide from a surface of the silicon substrate after depositing the filling material.

Figure 32:
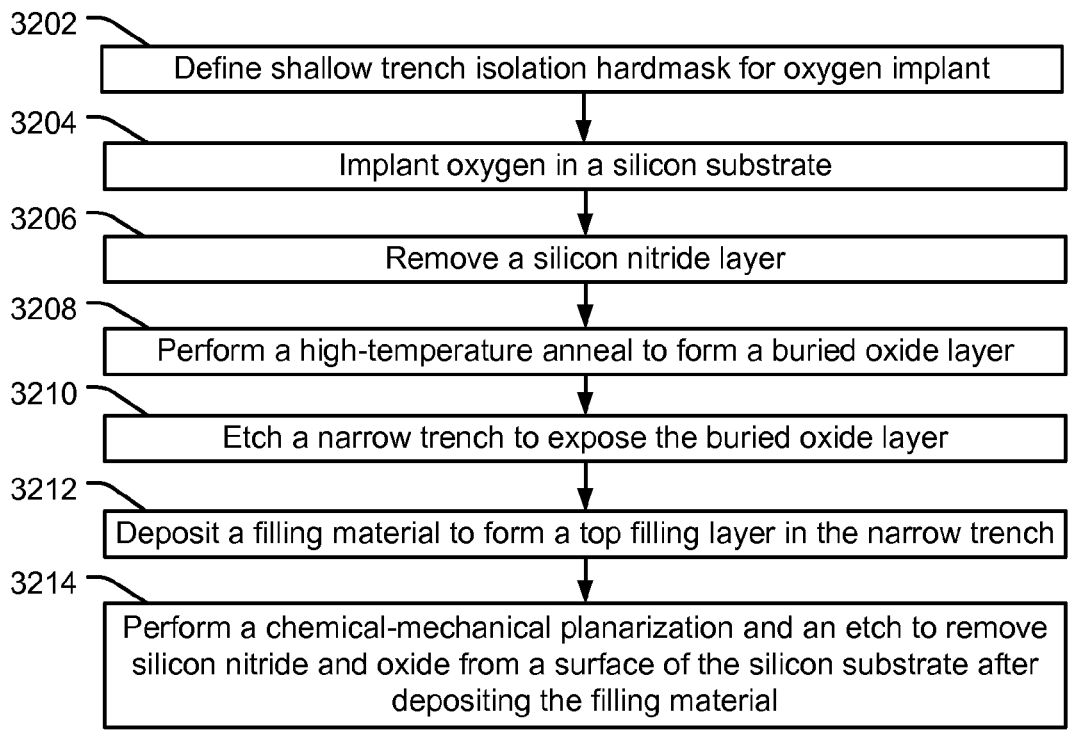
FIG. 32 is a flow chart of a fourth particular embodiment of a method of forming an isolation structure.

FIG. 32 is a flow chart of a fourth particular embodiment of a method of forming an isolation structure. In a particular embodiment, the method corresponds to FIGS. 9, 14, 15, 16, and 13. At 3202, a shallow trench isolation hardmask is defined for an oxygen implant. For example, silicon nitride material may be deposited to form a silicon nitride layer on the silicon substrate and a shallow trench may be patterned before implanting the oxygen layer.

Moving to 3204, oxygen is implanted into a silicon substrate. Proceeding to 3206, a layer of silicon nitride may be removed before performing the high-temperature anneal. Proceeding to 3208, a high-temperature anneal of the silicon substrate having the implanted oxygen is performed to form a substrate with a buried oxide layer. Advancing to 3210, a narrow trench is etched in a surface of the silicon substrate to expose the buried oxide layer. Continuing to 3212, a filling material is deposited into the trench to form a top filling layer in the narrow trench. Moving to 3215, a chemical-mechanical planarization and an etch may be performed to remove silicon nitride and oxide from a surface of the silicon substrate after depositing the filling material.

Figure 33:
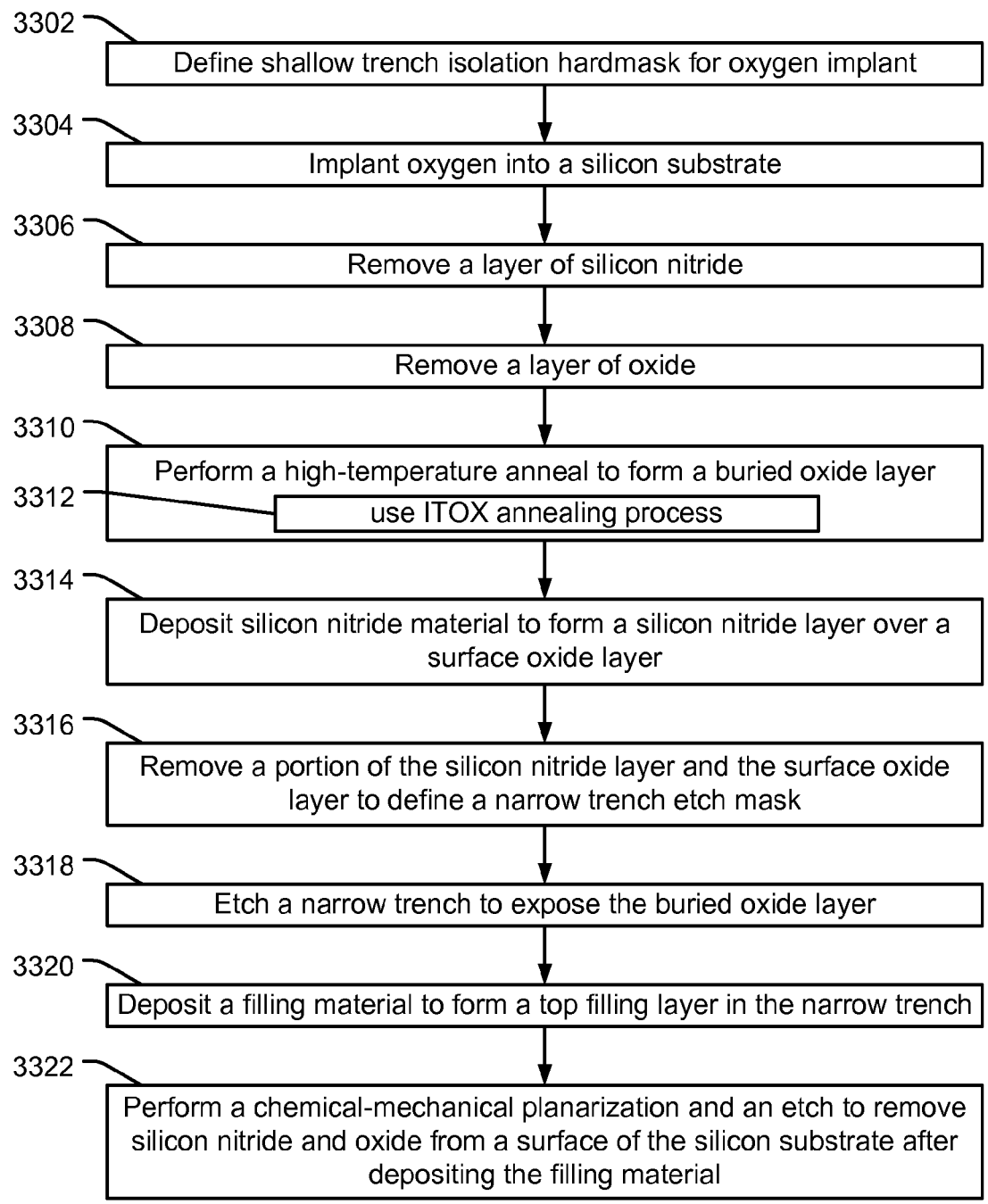
FIG. 33 is a flow chart of a fifth particular embodiment of a method of forming an isolation structure.

FIG. 33 is a flow chart of a fifth particular embodiment of a method of forming an isolation structure. In a particular embodiment, the method corresponds to FIGS. 17-22. At 3302, silicon nitride material may be deposited to form a silicon nitride layer on a silicon substrate and a shallow trench is patterned before implanting oxygen. The silicon nitride material may be deposited on an oxide layer grown on the silicon substrate. Moving to 3304, oxygen is implanted into the silicon substrate. Proceeding to 3306, the layer of silicon nitride may be removed before performing a high-temperature anneal. Advancing to 3308, a layer of oxide may also be removed before performing the high-temperature anneal.

Continuing to 3310, a high-temperature anneal of the silicon substrate having the implanted oxygen is performed to form a substrate with a buried oxide layer. The high-temperature anneal may performed using an internal thermal oxidation (ITOX) annealing process, at 3312. The ITOX annealing process may create a surface oxide layer on a surface of the silicon substrate. Moving to 3314, silicon nitride material may be deposited to form a silicon nitride layer over a surface oxide layer. The surface oxide layer may be the surface oxide layer created via the ITOX process, or may be a surface oxide layer grown after the layer created by the ITOX process has been removed. Proceeding to 3316, a portion of the silicon nitride layer and the surface oxide layer may be removed to define a narrow trench etch mask.

Advancing to 3318, a narrow trench is etched in a surface of the silicon substrate to expose the buried oxide layer. Continuing to 3320, a filling material is deposited into the trench to form a top filling layer in the narrow trench. Moving to 3322, a chemical-mechanical planarization and an etch may be performed to remove silicon nitride and oxide from a surface of the silicon substrate after depositing the filling material.

Figure 34:
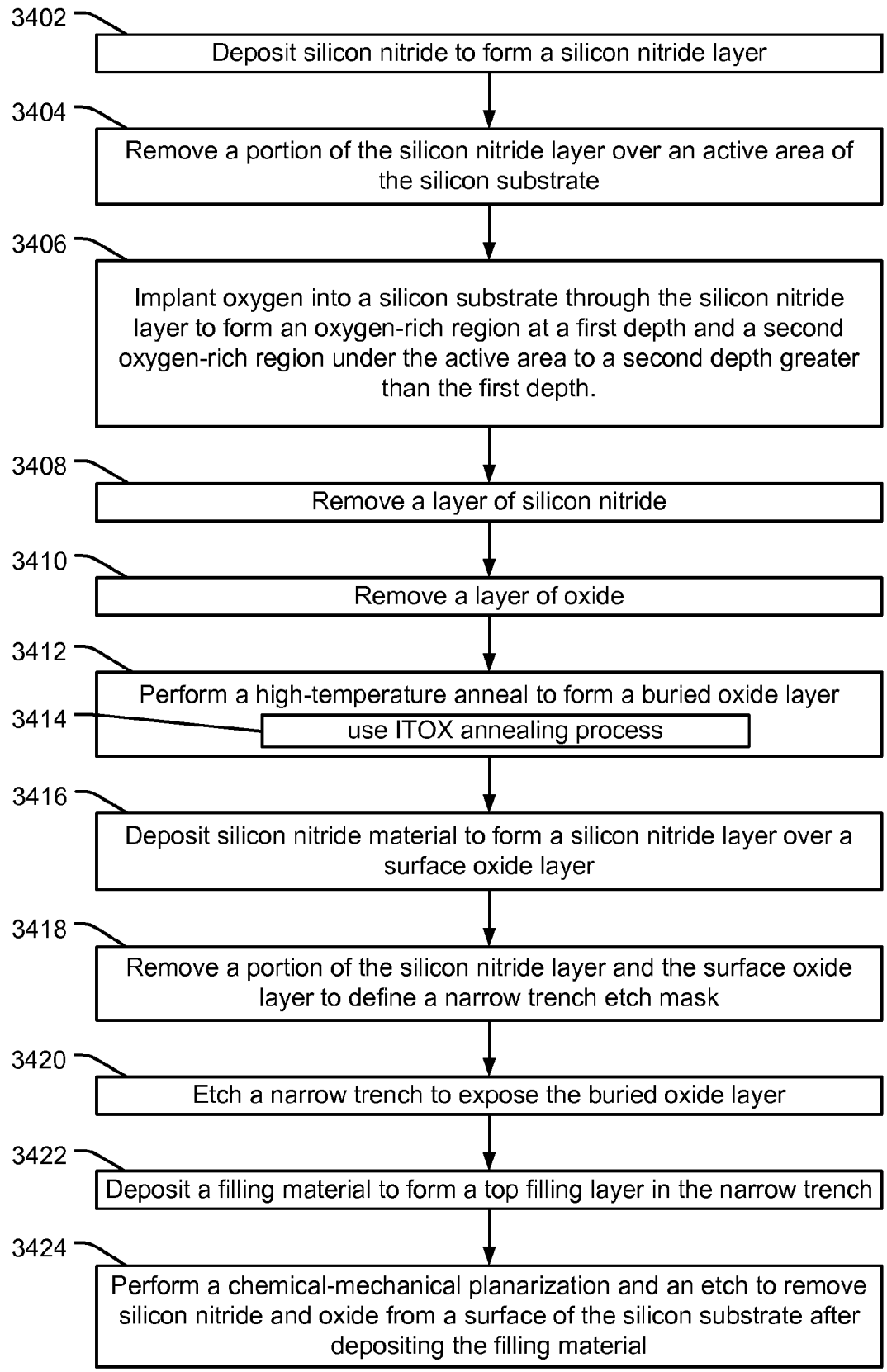
FIG. 34 is a flow chart of a sixth particular embodiment of a method of forming an isolation structure.

FIG. 34 is a flow chart of a sixth particular embodiment of a method of forming an isolation structure. In a particular embodiment, the method corresponds to FIGS. 23-28. At 3402, silicon nitride material is deposited to form a silicon nitride layer on a silicon substrate. Continuing to 3404, a portion of the silicon nitride layer is removed over an active area of the silicon substrate.

Moving to 3406, oxygen is implanted through the silicon nitride layer to form an oxygen-rich region at a first depth and a second oxygen-rich region under the active area to a second depth greater than the first depth. Proceeding to 3408, the layer of silicon nitride may be removed before performing a high-temperature anneal. Advancing to 3410, a layer of oxide may also be removed before performing the high-temperature anneal.

Continuing to 3412, a high-temperature anneal of the silicon substrate having the implanted oxygen is performed to form a substrate with a buried oxide layer. The high-temperature anneal may performed using an internal thermal oxidation (ITOX) annealing process, at 3414. The ITOX annealing process may create a surface oxide layer on a surface of the silicon substrate. The buried oxide layer may be formed at a first depth, and a second oxide layer may be formed under the active area at a second depth greater than the first depth so that the buried oxide layer does not contact the second oxide layer.

Moving to 3416, silicon nitride material may be deposited to form a silicon nitride layer over a surface oxide layer. The surface oxide layer may be the surface oxide layer created via the ITOX process, or may be a surface oxide layer grown after the layer created by the ITOX process has been removed. Proceeding to 3418, a portion of the silicon nitride layer and the surface oxide layer may be removed to define a narrow trench etch mask.

Advancing to 3420, a narrow trench is etched in a surface of the silicon substrate to expose the buried oxide layer. Continuing to 3422, a filling material is deposited into the trench to form a top filling layer in the narrow trench. Moving to 3424, a chemical-mechanical planarization and an etch may be performed to remove silicon nitride and oxide from a surface of the silicon substrate after depositing the filling material.

Those of skill would further appreciate that the various illustrative logical blocks, configurations, and algorithm steps described in connection with the embodiments disclosed herein may be implemented in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, performed manually, or any combination thereof. For example the methods or algorithms may be incorporated into manufacturing, design, or fabrication software, libraries, data files, or other software modules stored in or transported by electronic media. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal. As another example, the processor and the storage medium may be incorporated into or coupled to control equipment to fabricate or manufacture semiconductor devices or portions thereof.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   implanting oxygen under a bottom surface of a narrow trench of a silicon substrate;
   performing a high-temperature anneal of the silicon substrate including the implanted oxygen to form a buried oxide layer;
   etching the bottom surface of the narrow trench to reach the buried oxide layer; and
   depositing a filling material to form a top filling layer in the narrow trench.

2. The method of claim 1, wherein the oxygen is implanted using multiple implant energies, and wherein a lowest implant energy of the multiple implant energies results in a mean implant depth of at least a few hundred angstroms under the bottom surface of the narrow trench.

3. The method of claim 1, wherein the oxygen is implanted using multiple implant energies, and wherein a lowest implant energy of the multiple implant energies results in a lateral straggle distance of the oxygen that is less than 35% of a mean implant depth corresponding to the lowest implant energy.

4. The method of claim 1, wherein the filling material is an oxide material.

5. The method of claim 1, further comprising performing a shallow trench etch to form the narrow trench before implanting the oxygen under the bottom surface of the narrow trench.

6. The method of claim 1, further comprising removing a silicon nitride layer before performing the high-temperature anneal.

7. The method of claim 1, wherein an oxide barrier formed by the buried oxide layer and the top filling layer has an effective aspect ratio within a first range of approximately 5 to 6 with a narrow trench aspect ratio within a second range of approximately 3 to 4 including a silicon nitride layer.

8. The method of claim 1, wherein an oxide barrier formed by the buried oxide layer and the top filling layer has an effective aspect ratio within a first range of approximately 3 to 4 with a narrow trench aspect ratio within a second range of approximately 1 to 2.

9. The method of claim 1, wherein the narrow trench has a width that is less than 70 nm.

10. A semiconductor product including an isolation structure, wherein the isolation structure is produced according to the method of claim 1.

11. A method comprising:
  implanting oxygen into a silicon substrate;
  performing a high-temperature anneal of the silicon substrate having the implanted oxygen to form a substrate with a buried oxide layer, wherein the buried oxide layer has a first height;
  etching a narrow trench in a surface of the silicon substrate to expose the buried oxide layer, wherein the narrow trench has a second height;
  depositing a filling material into the trench to form a top filling layer in the narrow trench; and
  wherein a distance from a top surface of the silicon substrate to a bottom surface of the buried oxide layer is approximately equal to a sum of the first height and the second height.

12. The method of claim 11, further comprising:
  depositing silicon nitride material to form a silicon nitride layer on the silicon substrate and patterning a shallow trench before implanting the oxygen into the silicon substrate.

13. The method of claim 11, further comprising:
  performing a chemical-mechanical planarization and an etch to remove silicon nitride and oxide from a surface of the silicon substrate after depositing the filling material.

14. The method of claim 11, further comprising:
  removing a layer of silicon nitride before performing the high-temperature anneal.

15. The method of claim 14, further comprising:
  removing a layer of oxide before performing the high-temperature anneal, and wherein the high-temperature anneal is performed using an internal thermal oxidation (ITOX) annealing process.

16. The method of claim 15, wherein the ITOX annealing process creates a surface oxide layer on a surface of the silicon substrate, and further comprising:
  depositing silicon nitride material to form a silicon nitride layer over the surface oxide layer; and
  removing a portion of the silicon nitride layer and the surface oxide layer to define a narrow trench etch mask.

17. The method of claim 11, further comprising:
  depositing silicon nitride material to form a silicon nitride layer on the silicon substrate;
  removing a portion of the silicon nitride layer over an active area of the silicon substrate, wherein the oxygen is implanted in the silicon substrate through the silicon nitride layer to a first depth, wherein a second oxide layer is formed under the active area at a second depth greater than the first depth, and wherein the buried oxide layer does not contact the second oxide layer.

18. A semiconductor product including a structure formed using the method of claim 11.

19. The method of claim 1, wherein the high-temperature anneal is performed at a temperature greater than 1,000 degrees Celsius.

20. The method of claim 11, wherein an oxide barrier formed by the buried oxide layer and the top filling layer has an effective aspect ratio within a first range of approximately 5 to 6 with a narrow trench aspect ratio within a second range of approximately 3 to 4.

* * * * *